(12) United States Patent
Takiguchi et al.

(10) Patent No.: US 9,948,060 B2
(45) Date of Patent: Apr. 17, 2018

(54) SEMICONDUCTOR LASER DEVICE

(71) Applicant: HAMAMATSU PHOTONICS K.K., Hamamatsu-shi, Shizuoka (JP)

(72) Inventors: Yuu Takiguchi, Hamamatsu (JP); Kazuyoshi Hirose, Hamamatsu (JP); Yoshitaka Kurosaka, Hamamatsu (JP); Takahiro Sugiyama, Hamamatsu (JP); Yoshiro Nomoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/538,219

(22) PCT Filed: Dec. 24, 2015

(86) PCT No.: PCT/JP2015/086039
§ 371 (c)(1),
(2) Date: Jun. 21, 2017

(87) PCT Pub. No.: WO2016/104610
PCT Pub. Date: Jun. 30, 2016

(65) Prior Publication Data
US 2017/0338624 A1   Nov. 23, 2017

(30) Foreign Application Priority Data
Dec. 24, 2014 (JP) .................... 2014-261094

(51) Int. Cl.
*H01S 3/038* (2006.01)
*H01S 5/042* (2006.01)
(Continued)

(52) U.S. Cl.
CPC ........... *H01S 5/0425* (2013.01); *H01S 5/026* (2013.01); *H01S 5/0228* (2013.01); *H01S 5/12* (2013.01);
(Continued)

(58) Field of Classification Search
CPC .. H01S 5/18394; H01S 3/0381; H01S 3/0388; H01S 3/0385
(Continued)

(56) References Cited

U.S. PATENT DOCUMENTS

| 9,660,415 B2 * | 5/2017 | Takiguchi | ......... G02F 1/133615 |
| 2016/0064894 A1 * | 3/2016 | Takiguchi | ......... G02F 1/133615 |
| | | | 372/26 |

FOREIGN PATENT DOCUMENTS

| JP | 2000-332351 A | 11/2000 |
| JP | 2010-219307 A | 9/2010 |

(Continued)

OTHER PUBLICATIONS

Eiji Miyai et al., "Lasers producing tailored beams," Nature, Jun. 22, 2006, p. 946, vol. 441, including Supplementary Information pp. 1-6.

(Continued)

*Primary Examiner* — Tuan Nguyen
(74) *Attorney, Agent, or Firm* — Drinker Biddle & Reath LLP

(57) ABSTRACT

This semiconductor laser device includes a semiconductor laser chip and a spatial light modulator SLM optically coupled to the semiconductor laser chip. The semiconductor laser chip LDC includes an active layer 4, a pair of cladding layers 2 and 7 sandwiching the active layer 4, a diffraction grating layer 6 optically coupled to the active layer 4, and a drive electrode E3 that is disposed between the cladding layer 2 and the spatial light modulator SLM and supplies an electric current to the active layer 4, and the drive electrode E3 is positioned within an XY plane and has a plurality of openings as viewed from a Z-axis direction and has a non-periodic structure.

6 Claims, 22 Drawing Sheets

(51) Int. Cl.
  *H01S 5/022*   (2006.01)
  *H01S 5/026*   (2006.01)
  *H01S 5/12*    (2006.01)
  *H01S 5/18*    (2006.01)
  *H01S 5/343*   (2006.01)

(52) U.S. Cl.
  CPC ............ *H01S 5/18* (2013.01); *H01S 5/34313* (2013.01); *H01S 5/34353* (2013.01); *H01S 2301/02* (2013.01)

(58) Field of Classification Search
  USPC ...................................... 372/38.05; 359/386
  See application file for complete search history.

(56) References Cited

FOREIGN PATENT DOCUMENTS

| WO | WO-2014/175447 A1 | 10/2014 | |
|---|---|---|---|
| WO | WO 2015/008627 | * 1/2015 | ............. H01S 5/026 |
| WO | WO-2015/008627 A1 | 1/2015 | |

OTHER PUBLICATIONS

Kyosuke Sakai et al., "Optical trapping of metal particles in doughnut-shaped beam emitted by photonic-crystal laser," Electronic Letters, Jan. 18, 2007, pp. 107-108, vol. 43, No. 2.
International Preliminary Report on Patentability dated Jul. 6, 2017 for PCT/JP2015/086039.

* cited by examiner

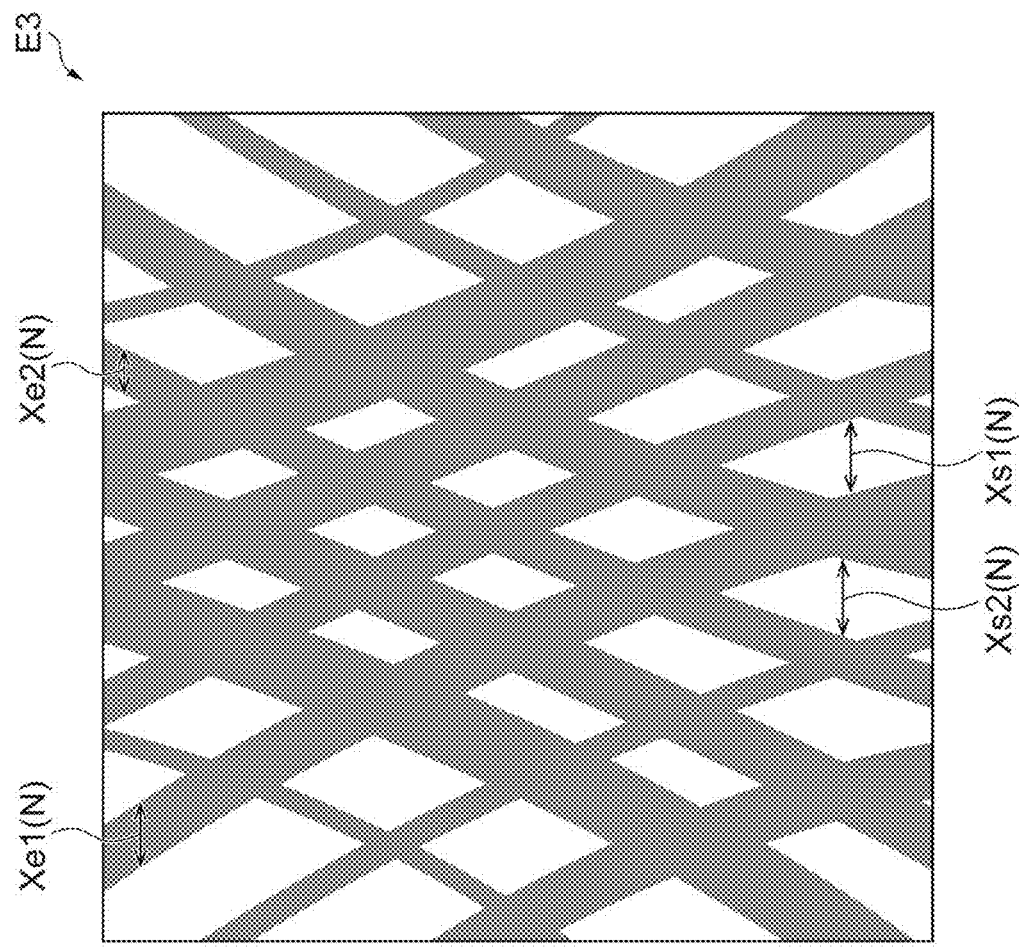
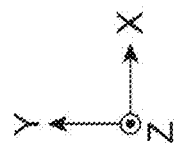
Fig.11

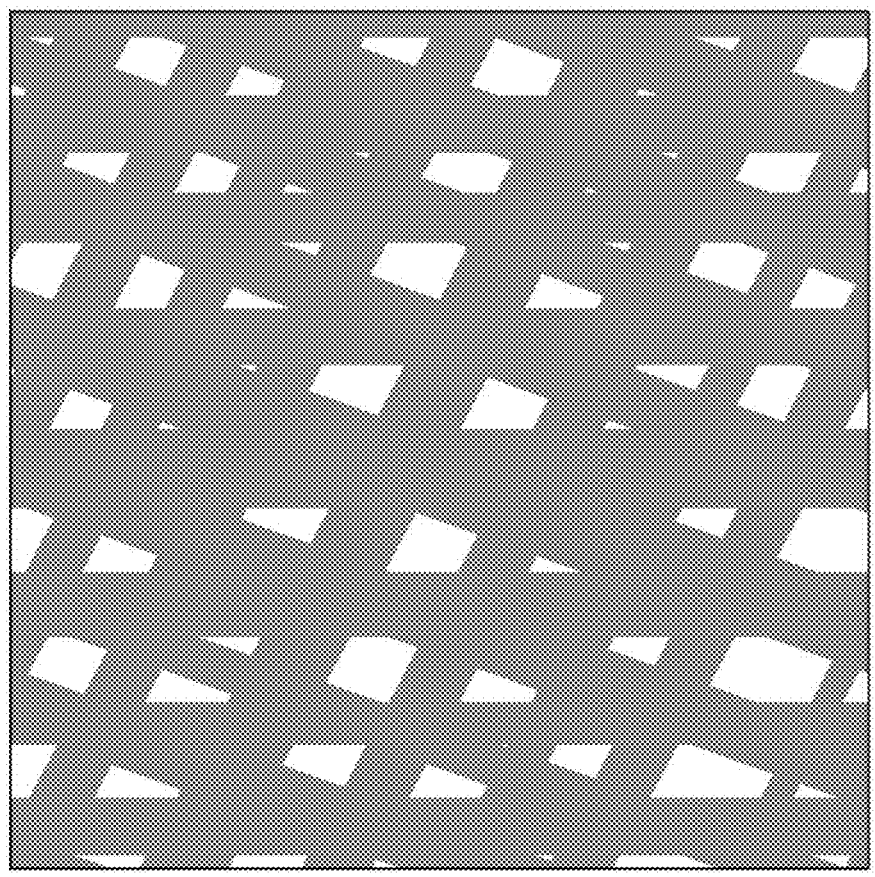
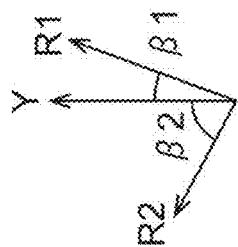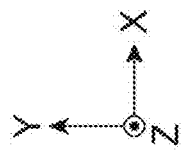
Fig.12

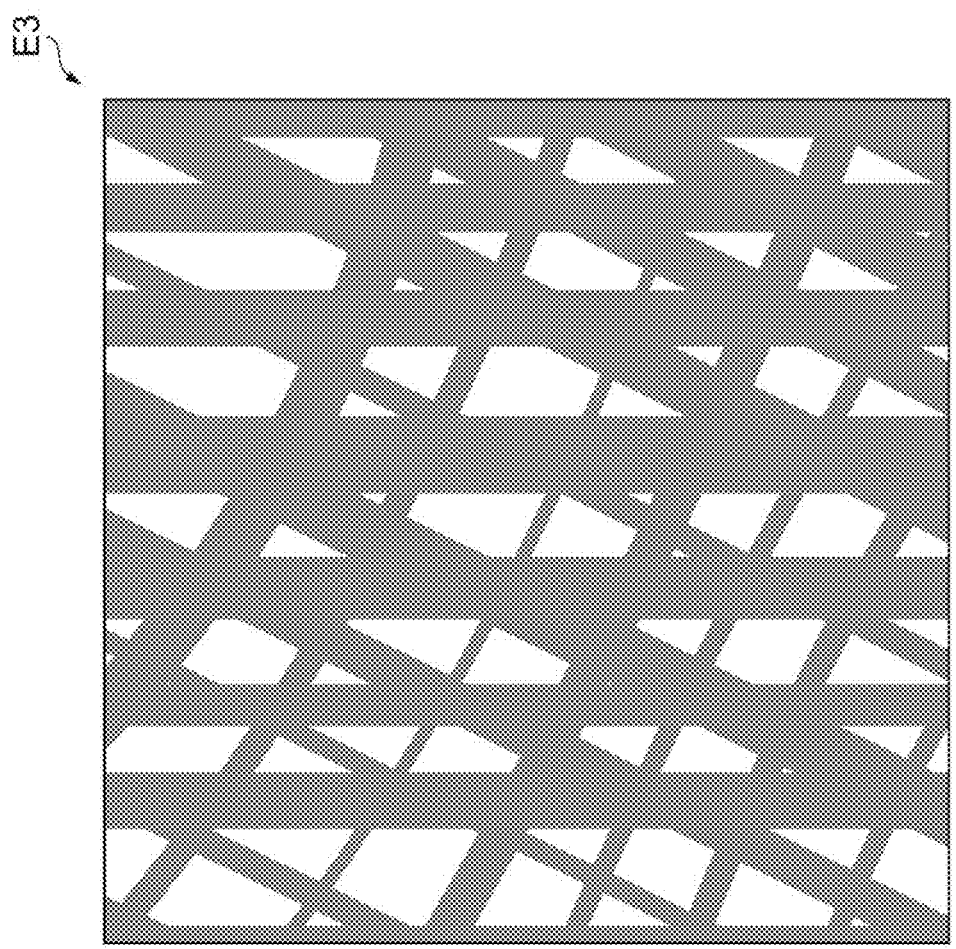
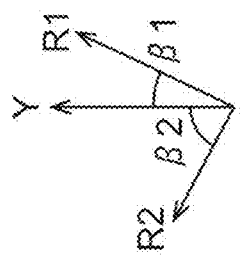
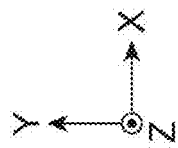
Fig.13

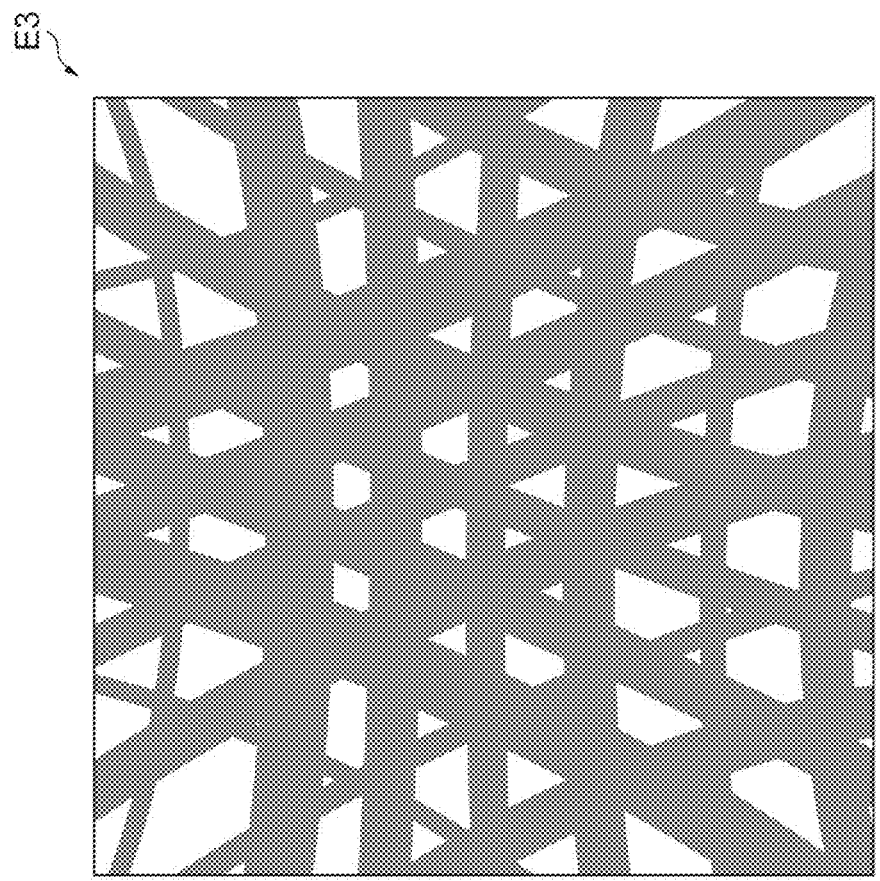
Fig.14

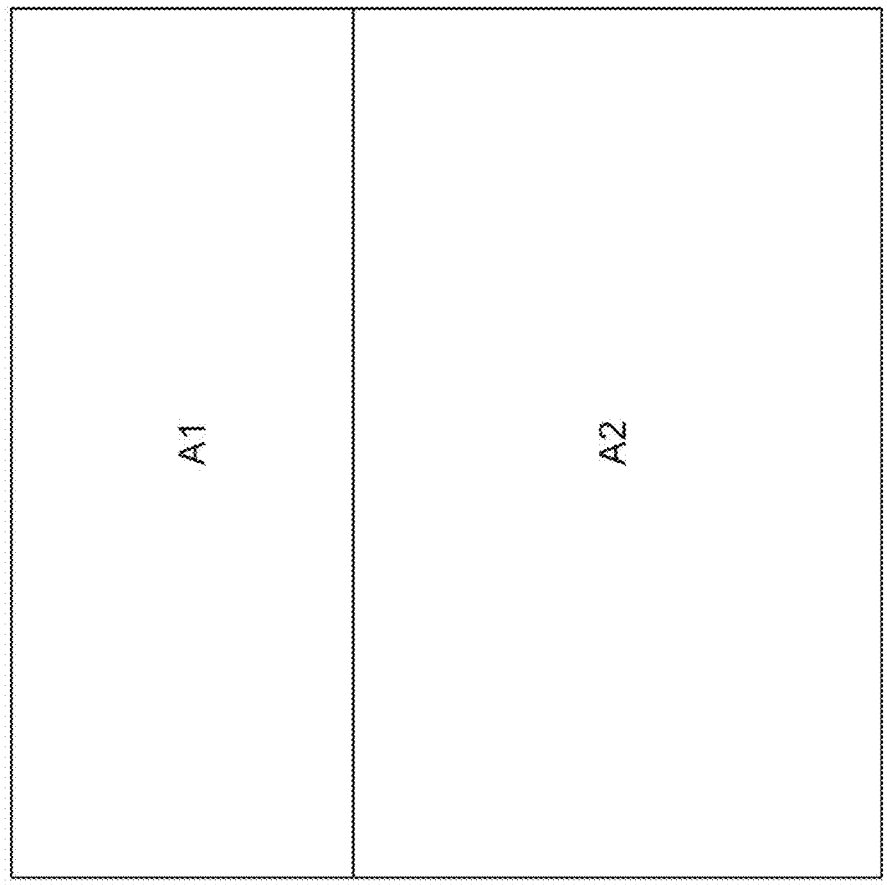
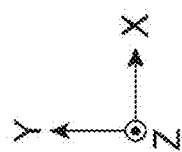
Fig.15

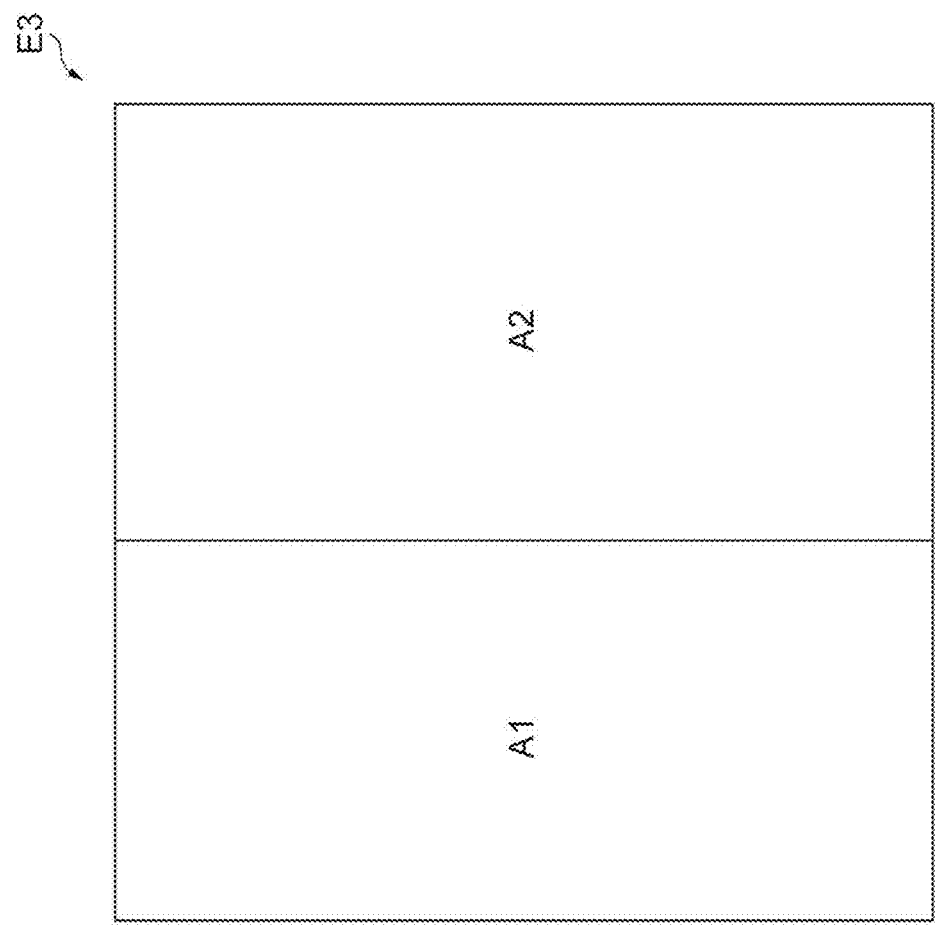
Fig. 18
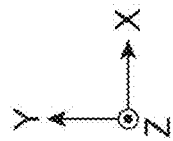

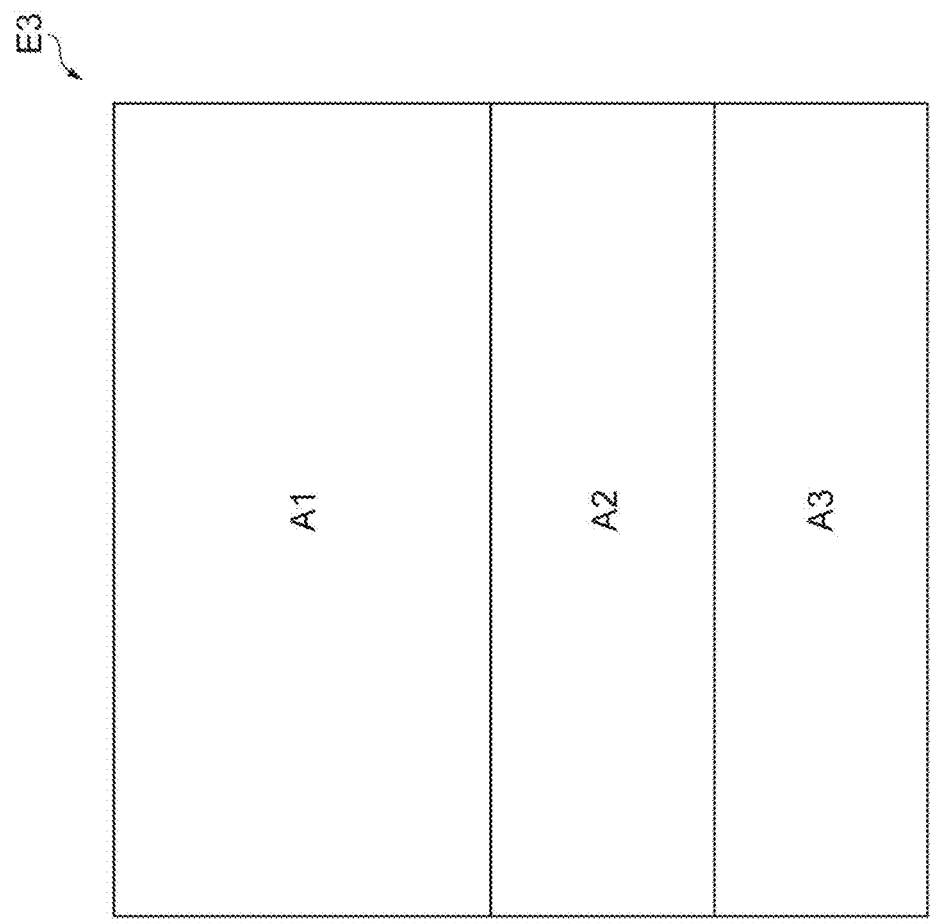
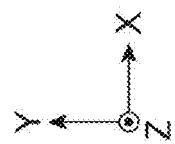
Fig.20

SEMICONDUCTOR LASER DEVICE

TECHNICAL FIELD

The present invention relates to a semiconductor laser device.

BACKGROUND ART

Patent Literature 1 discloses a surface-emitting laser element having a two-dimensional periodic structure. This surface-emitting laser element includes a photonic crystal layer. The photonic crystal layer disclosed in the same Literature has a structure in which holes are periodically provided in two orthogonal directions. Non-Patent Literature 1 discloses an example in which a phase shift region having a period different from that of the surrounding is inserted between hole forming regions. By using a phase shift region, a beam pattern different from that obtained without using a phase shift region can be obtained. Particularly, an annular beam is effective for optical tweezers. With a normal unimodal beam, it is difficult to capture an opaque substance, however, an annular beam can also be used to capture an opaque substance (Non-Patent Literature 2). Patent Literature 2 discloses a projector using a surface-emitting laser element. Generally, a projector is a device that forms a desired image by selectively transmitting/blocking light for each pixel, and does not control a phase of a wavefront for each pixel.

If it is possible to control phases of wavefronts of the respective micro areas of a two-dimensionally spreading laser beam, by overlapping wave fronts of the respective micro areas, a desired image can be obtained. Considering that a far-field image of a laser is obtained by Fourier-transforming a near field image of the two-dimensionally spreading laser beam, various applications of such a semiconductor laser device can be expected. It is known that a reproduced image can be obtained by applying Fourier transform to a hologram, and a device for this is expected to be also used for hologram designing, etc. A Fourier transform image is used for image processing in an inspection device and pattern matching, etc.

CITATION LIST

Patent Literature

Patent Document 1: Japanese Unexamined Patent Publication No. 2000-332351
Patent Document 2: Japanese Unexamined Patent Publication No. 2010-219307

Non Patent Literature

Non-Patent Document 1: Eiji Miyai, et. al., "Lasers producing tailored beams," Nature, Vol. 441, p. 946 (2006)
Non-Patent Document 2: Kyosuke Sakai, et. al., "Optical trapping of metal particles in doughnut-shaped beam emitted by photonic-crystal laser," Electronics Letters, Vol. 43, pp. 107-108 (2007)

SUMMARY OF INVENTION

Technical Problem

However, conventionally, no semiconductor laser device capable of performing wavefront control, that is, phase control for each micro area was known, and it was impossible to, by such a semiconductor laser device, freely overlap wavefronts to form a variable desired laser beam pattern. In order to solve this problem, the inventors of the present invention have developed a semiconductor laser device by overlaying a semiconductor laser chip and a spatial light modulator on one another, and have found that noise light is contained in a laser beam to be output.

The present invention was made in view of this problem, and an object thereof is to provide a semiconductor laser device capable of reducing noise light and forming a variable desired laser beam pattern.

Solution to Problem

In order to solve the above-described problem, a first semiconductor laser device includes a semiconductor laser chip and a spatial light modulator optically coupled to the semiconductor laser chip, and modulates a laser beam output along a thickness direction of the semiconductor laser chip by the spatial light modulator and outputs the laser beam to the outside, wherein the semiconductor laser chip includes an active layer, a pair of cladding layers sandwiching the active layer, a diffractive grating layer optically coupled to the active layer, and a drive electrode that is disposed between the cladding layer on the spatial light modulator side and the spatial light modulator, and supplies an electric current to the active layer, and in a case where an XYZ three-dimensional orthogonal coordinate system is set, a thickness direction of the semiconductor laser chip is set as a Z-axis direction, and a plane parallel to an interface between the semiconductor laser chip and the spatial light modulator is set as an XY plane, the drive electrode is positioned within the XY plane, the drive electrode has a plurality of openings as viewed from the Z-axis direction, and the drive electrode has a non-periodic structure.

As a result of earnest study, the inventors of the present invention found that, when a condition that caused phases of a transmitting laser beam to overlap or a condition that caused phases of a reflected laser beam to overlap in the drive electrode was satisfied, noise light was generated. That is, when the drive electrode has a structure that has a plurality of openings and causes transmission through these, at the time of transmission, if an alignment pattern of the openings is periodic, noise light is generated by interference of laser beams, and at the time of reflection, if the alignment pattern of conductive regions constituting the drive electrode is periodic, noise light is generated by interference of laser beams.

Therefore, in the present invention, by adopting a non-periodic structure for the drive electrode, such interference is prevented, and generation of noise light is prevented.

Preferably, in a second semiconductor laser device, the drive electrode includes a plurality of conductive regions linearly extending along a first direction within the XY plane, and when widths of the conductive regions in the X-axis direction are Xe, intervals between the conductive regions in the X-axis direction are Xs, N is an integer, a width Xe of the conductive region positioned N-th along the X-axis direction is Xe(N), and an interval Xs positioned N-th along the X-axis direction is Xs(N), the widths Xe are not periodic, Xe(N) and Xe(N+1) are different from each other, the intervals Xs are not periodic, and Xs(N) and Xs(N+1) are different from each other.

Since the widths Xe of the conductive regions are not periodic, laser beams reflected thereon are prevented from interfering with each other and causing generation of noise light, and since the intervals Xs between the conductive regions defining the openings are not periodic, laser beams transmitted through the openings are prevented from interfering with each other and causing generation of noise light.

In the semiconductor laser device, the semiconductor laser chip is rectangular within the XY plane, and when a direction parallel to one side of the rectangle is set as a Y axis, an angle $\beta$ between the first direction and the Y axis may be set to $\beta \neq n \times 90°$ (n: arbitrary integer).

In a third semiconductor laser device, the drive electrode has a shape in which a plurality of first conductive regions extending along a first direction and a plurality of second conductive regions extending along a second direction different from the first direction overlap so as to form a plurality of openings two-dimensionally positioned within the XY plane, and when widths of the first conductive regions in the X-axis direction are Xe1, intervals between the first conductive regions in the X-axis direction are Xs1, N is an integer, a width Xe1 of the first conductive region positioned N-th along the X-axis direction is Xe1(N), and an interval Xs1 positioned N-th along the X-axis direction is Xs1(N), the widths Xe1 are not periodic, Xe1(N) and Xe1(N+1) are different from each other, the intervals Xs1 are not periodic, and Xs1(N) and Xs1(N+1) are different from each other.

In this case, the same noise light prevention effect as described above can also be obtained, and due to the presence of the second conductive regions, a resistance of the drive electrode can be reduced as a whole, and a drive current can be efficiently supplied to the active layer.

Each conductive region may extend linearly or in a curve.

In a fourth semiconductor laser chip, both or either of the first conductive regions and the second conductive regions extend in arcs. In this case, as compared with a case where the conductive regions linearly extend, regularity among the conductive regions further deteriorates, so that non-periodicity and randomness of the structure of the drive electrode are improved and noise light is further prevented, and the shape thereof is an arc being a gentle continuous change in direction, so that harmonic noise light to be caused by a rapid change in shape is also hardly generated.

In a fifth semiconductor laser device, the drive electrode has a shape in which a plurality of first conductive regions extending along a first direction, a plurality of second conductive regions extending along a second direction different from the first direction, and a plurality of third conductive regions extending along a third direction different from both of the first direction and the second direction overlap so as to form a plurality of openings two-dimensionally positioned within the XY plane.

That is, the opening is constructed by being surrounded by conductive regions extending in several directions, and the conductive regions may extend in three or more directions. It is considered that, if the conductive regions extend in more directions, randomness increases, and generation of noise light is further prevented.

In a sixth semiconductor laser device, a region in which the drive electrode is provided includes a first region in which a conductive region having a first non-periodic structure is formed and a second region in which a conductive region having a second non-periodic structure different from the first non-periodic structure is formed.

The first region and the second region have different patterns, so that laser beams from these regions are prevented from interfering with each other and causing generation of noise light.

Advantageous Effects of Invention

The semiconductor laser device of the present invention can form a variable desired laser beam pattern.

BRIEF DESCRIPTION OF DRAWINGS

FIG. 11 is a plan view of a drive electrode.
FIG. 12 is a plan view of a drive electrode.
FIG. 13 is a plan view of a drive electrode.
FIG. 14 is a plan view of a drive electrode.
FIG. 15 is a plan view of a drive electrode.
FIG. 18 is a plan view of a drive electrode.
FIG. 20 is a plan view of a drive electrode.

DESCRIPTION OF EMBODIMENTS

Hereinafter, semiconductor laser devices according to embodiments are described. The same components are designated by the same reference sign, and overlapping description thereof is omitted.

Figure 1:
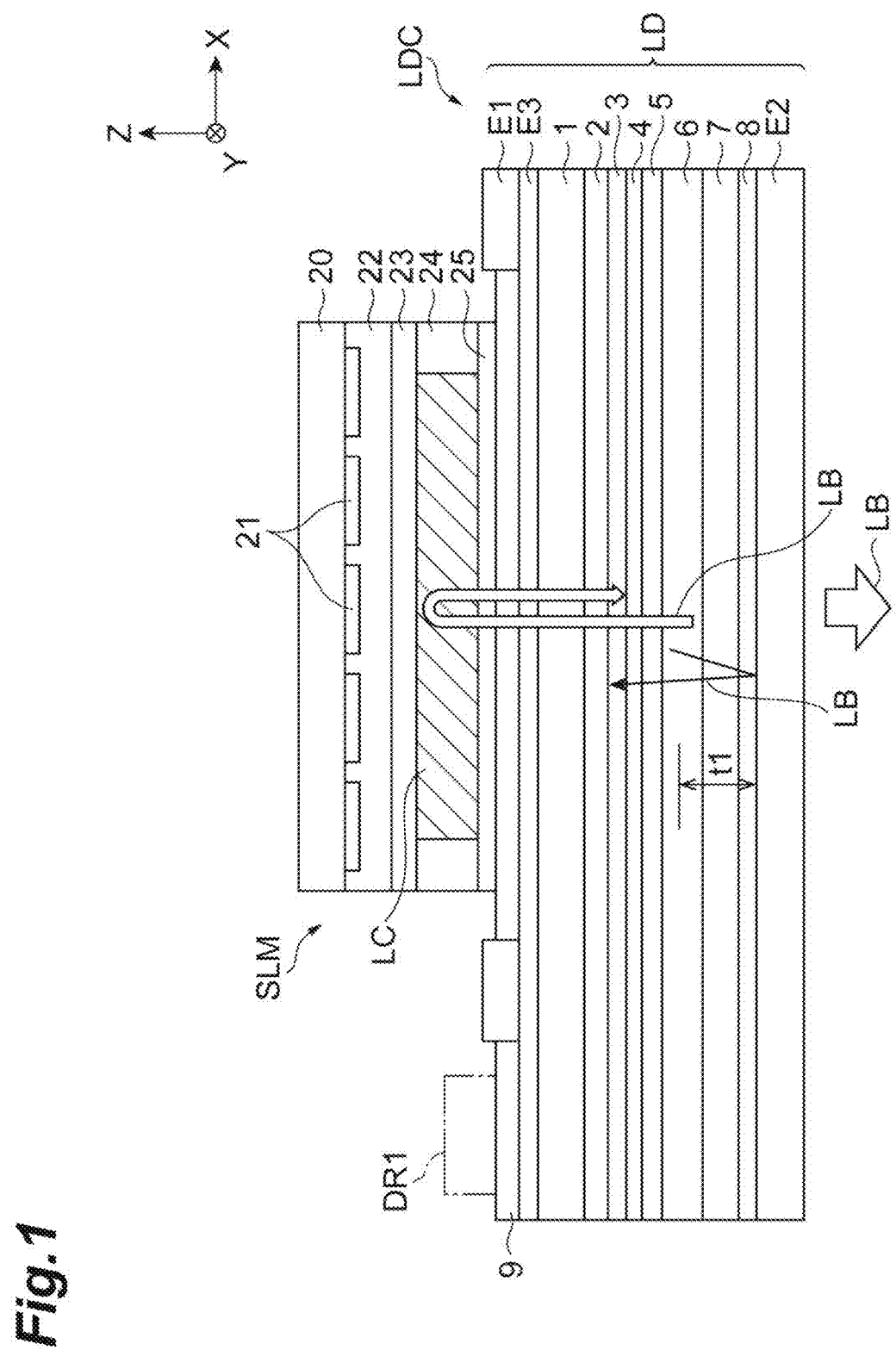
FIG. 1 is a longitudinal sectional view of a semiconductor laser device according to a first embodiment.

FIG. 1 is a longitudinal sectional view of a semiconductor laser device according to a first embodiment.

This semiconductor laser device includes a semiconductor laser chip LDC made of a compound semiconductor, and a spatial light modulator SLM optically coupled to the semiconductor laser chip LDC.

The semiconductor laser chip LDC includes a luminescent layer including an active layer 4, a pair of cladding layers 2 and 7 sandwiching the luminescent layer, and a diffraction grating layer 6 optically coupled to the luminescent layer. The luminescent layer includes the active layer 4 and, as necessary, light guide layers 3 and 5 sandwiching the active layer. The semiconductor laser chip LDC includes a semiconductor substrate 1. A thickness direction of the semiconductor substrate 1 is set as a Z axis, and two directions perpendicular to the Z axis are set as an X axis and a Y axis.

At the time of manufacturing, on a surface of the semiconductor substrate 1 in the −Z-axis direction, respective semiconductor layers are successively epitaxially grown. In this case, when the −Z-axis direction is an upward direction, on the semiconductor substrate 1, the lower cladding layer 2, the luminescent layer (the light guide layer 3, the active layer 4, and the light guide layer 5), the diffraction grating layer 6, the upper cladding layer 7, and a contact layer 8 are formed in order. On a surface of the semiconductor substrate 1 on the +Z-axis side, an electrode E1 is formed, and on the surface of the contact layer 8 on the −Z-axis side, an electrode E2 is formed. These electrodes E1 and E2 are drive electrodes, and between the electrode E1 and the semiconductor substrate 1, a drive electrode E3 having a plurality of stripe or mesh-like openings spreading over the entire surface of the semiconductor substrate is interposed.

When an electric current is supplied between the first electrode E1 (drive electrode E3) and the second electrode E2 from a drive circuit, the luminescent layer emits light. That is, when a drive current is supplied between the first electrode E1 and the second electrode E2, electrons and holes are recombined inside the active layer 4, and the active layer 4 emits light. Carriers contributing to the light emission and generated light are efficiently confined by and between the upper and lower light guide layers 3 and 5 and the cladding layers 2 and 7.

A laser beam LB generated in the luminescent layer propagates inside the diffraction grating layer 6, and the diffraction grating layer 6 outputs the laser beam in a direction perpendicular to the thickness direction, that is, the Z-axis direction. The laser beam output from the diffraction grating layer 6 advances in the +Z-axis direction, and enters the spatial light modulator SLM via the cladding layer 2 and the semiconductor substrate 1.

The spatial light modulator SLM is mounted to the semiconductor laser chip LDC so that a laser beam LB output along the thickness direction of the diffraction grating layer 6 is input therein. The laser beam enters a liquid crystal layer LC via a transparent one of a common electrode 25 and pixel electrodes 21 of the spatial light modulator SLM. The spatial light modulator SLM modulates phases of the respective micro areas of the laser beam LB by a drive voltage applied between the pixel electrodes and the common electrode, reflects the phase-modulated laser beam, and outputs it to the outside via the semiconductor laser chip.

In the laser beam LB output from the spatial light modulator SLM, phases of the respective micro areas are overlapped in an adjusted state to form various laser beam patterns. For example, a far-field image of the overlapped laser beam LB can compose a specific character.

The semiconductor laser device further includes a selection circuit (a row selection circuit DR1, a column selection circuit (not shown)) that is disposed on the semiconductor laser chip LDC and selectively applies a drive voltage between a pixel electrode positioned at a desired address and the common electrode. By providing this selection circuit on the semiconductor laser chip, without installing a large-scale external wiring group, the spatial light modulator can be controlled.

The spatial light modulator SLM includes a transparent common electrode 25, a plurality of transparent pixel electrodes 21, and a liquid crystal layer LC disposed between the common electrode 25 and the pixel electrodes 21. The liquid crystal layer LC is made of nematic liquid crystal or ferroelectric liquid crystal, etc. From the drive circuit, a drive current is supplied to the semiconductor laser chip constituting a semiconductor laser element via the drive electrode. Accordingly, a laser beam LB is output from the luminescent layer, and the laser beam LB reaches the liquid crystal layer LC via the pixel electrodes 21 of the spatial light modulator, and is phase-modulated in the liquid crystal layer LC and then reflected by a reflecting mirror or a reflection coating 23, and output to the outside via the common electrode 25. The common electrode 25 is connected to a fixed potential (ground), and the pixel electrodes 21 are connected to the row selection circuit DR1 via switching elements and row lines. Column lines extend from the column selection circuit, and are connected to control terminals of the switching elements. The switching element is a field-effect transistor. In this case, the control terminal serves as a gate of the transistor.

In the spatial light modulator, when a specific address (x, y) is designated, an ON signal is output to a column line at a coordinate x from the column selection circuit, and a desired potential is applied to a row line at a coordinate y from the row selection circuit DR1. In this case, between the pixel electrode 21 at the address (x, y) and the common electrode 25, a drive voltage is applied, a refractive index of the liquid crystal layer changes, and an optical path length changes and the phases of the laser beam is adjusted. In the spatial light modulator, the row direction and the column direction are subjectively determined, and are mutually replaceable directions. A magnitude of the drive voltage is determined based on an output potential from the row selection circuit DR1 and an output potential of the column selection circuit, and can be fixed, however, for more accurate phase control, for example, a variable resistance is connected for each switching element, and a value of the variable resistance is controlled by a selection circuit having the same configuration.

It is also allowed that, a phase distribution of the spatial light modulator is measured in advance, and a storage device to correct the phase distribution and a spatial light modulator drive circuit that generates a drive voltage to be applied to each pixel electrode via the selection circuit based on data stored in the storage device, are provided so that the device outputs a desired pattern even if there is a variation in phase of the spatial light modulator within a plane at the time of manufacturing. That is, this semiconductor laser device can include a storage device that stores an initial phase correction value to correct in-plane variation in phase based on measured values measured in advance of phase distribution of the spatial light modulator, and applies different initial phases for each pixel electrode of the spatial light modulator. In other words, this device includes a storage device (not shown) that stores an initial correction value of a drive voltage for each pixel electrode. A drive voltage is applied from a control device (not shown) to row and column selection circuits, and this drive voltage and an initial correction value are stored in the storage device. A reference phase distribution and a measured phase distribution are compared with each other, and a value of a drive voltage corresponding to a phase difference for each pixel can be used as an initial correction value, and when a drive voltage of an initial correction value is applied to the pixel electrode, the reference phase distribution is realized. In order to obtain a desired phase distribution, a desired drive voltage can be superimposed on a drive voltage corresponding to the initial correction value.

A laser beam output in the thickness direction from the dial action grating layer 6 reaches the liquid crystal layer LC via the common electrode 25 (or the pixel electrodes 21 when the position of the common electrode and the position of the pixel electrodes are switched). A permittivity (refractive index) of the liquid crystal layer LC changes according to a voltage applied to the pixel electrodes 21, and therefore, an optical path length of the liquid crystal layer LC with respect to the laser beam changes, and the phase changes. The phase of the laser beam LB that was transmitted and reciprocated through the liquid crystal layer LC is modulated for each pixel electrode 21. Therefore, wavefront control for each micro area can be performed, and a desired variable laser beam pattern by overlap of wavefronts can be formed.

On the drive electrode E3, a transparent insulating film 9 made of SiO$_2$ or SiNx is formed. On the transparent insulating film 9, the common electrode 25 of the spatial light modulator SLM is disposed. On the common electrode 25, a frame-shaped spacer 24 to hold the liquid crystal is provided, and the liquid crystal layer LC is filled in the internal space of the spacer 24. On the spacer 24 and the liquid crystal layer LC, the reflection coating 23 is formed, and on the reflection coating 23, the plurality of pixel electrodes 21 are disposed via a protective film 22. The pixel electrodes 21 are positioned between a substrate 20 and the protective film 22. When forming the pixel electrodes 21, etc., preferably, on the substrate 20 made of a semiconductor, the pixel electrodes 21 are formed, and then, to flatten the surfaces thereof, the pixel electrodes 21 are coated with the protective film 22, and further, the reflection coating 23 is formed on the protective film 22, and this intermediary substrate is inverted and disposed on the frame-shaped spacer 24. Appropriate oriented films are provided on upper and lower surfaces of the liquid crystal layer LC.

A laser beam LB reflected by the reflection coating 23 on the liquid crystal layer LC is output to the outside via the common electrode 25 and the semiconductor laser chip LDC. A distance t1 between (a central position in the thickness direction of) the diffraction grating layer 6 and the contact layer 8 is set so that a laser beam LB reflected by an exposed surface of the contact layer 8 in the semiconductor laser chip and light directly advancing from the diffraction grating layer 6 toward the spatial light modulator SLM intensify each other. That is, the distance t1 can satisfy the following relationship: $2 \times t1 = \lambda \times N$ or $2 \times t1 = \lambda \times (N \pm \frac{1}{2})$. Here, $\lambda$, is a wavelength of the laser beam, and N is an integer.

The luminescent layer includes the active layer 4 and light guide layers 3 and 5 sandwiching the active layer, and the contact layer 8 is provided as necessary. The semiconductor laser chip includes a laser beam generating region LD in which the active layer 4 is formed, and the diffraction grating layer 6 is positioned in the laser beam generating region LD, and outputs a laser beam LB in the thickness direction of the diffraction grating layer 6. The spatial light modulator SLM is mounted on the laser beam generating region LD. With this structure, by disposing the spatial light modulator SLM on the laser beam generating region LD, the device can be downsized.

On the surface of the semiconductor substrate 1 on the +Z side, the drive electrode E3 is disposed. This semiconductor laser device includes the semiconductor laser chip LDC and the spatial light modulator SLM optically coupled to the semiconductor laser chip LDC, and modulates a laser beam LB output along the thickness direction of the semiconductor laser chip LDC by the spatial light modulator SLM and outputs the laser beam to the outside, and the semiconductor laser chip LDC includes the active layer 4, the pair of cladding layers 2 and 7 sandwiching the active layer 4, the diffraction grating layer 6 optically coupled to the active layer 4, and the drive electrode E3 that is disposed between the cladding layer 2 on the spatial light modulator SLM side and the spatial light modulator SLM and supplies an electric current to the active layer 4.

The XYZ three-dimensional orthogonal coordinate system is set, and in a case where the thickness direction of the semiconductor laser chip LDC is set as a Z-axis direction, and a plane parallel to an interface between the semiconductor laser chip LDC and the spatial light modulator SLM is set as an XY plane, the drive electrode E3 is positioned within the XY plane. The drive electrode E3 has a plurality of openings as viewed in the Z-axis direction, and the drive electrode E3 has a non-periodic structure.

Here, in order to prevent noise light from being contained in the laser beam, a non-periodic structure was adopted as a structure of the drive electrode E3. When a condition that caused phases of a transmitting laser beam to overlap or a condition that caused phases of a reflected laser beam to overlap in the drive electrode E3 was satisfied, noise light was observed. That is, in the case where the drive electrode E3 has a plurality of openings and is structured to cause transmission through the openings, when an alignment pattern of the openings is periodic at the time of transmission, noise light is generated due to interference of laser beams, and at the time of reflection, when an alignment pattern of conductive regions constituting the drive electrode E3 is periodic, noise light is generated due to interference of laser beams.

Therefore, in the present embodiment, by adopting a non-periodic structure for the drive electrode E3, such interference is prevented and generation of noise light is prevented.

As a material of the conductive regions constituting the drive electrode E3, a metal such as Ag and Au can be used, and it is also possible to form conductive regions by diffusing an impurity of a higher concentration in the semiconductor substrate 1. As a material of the drive electrode E3, a transparent electrode of ITO, ZnO, graphene, or an Ag nanowire, etc., can be used, however, a lower-resistance material is more preferable, so that an opaque metal material having stripe or mesh-like openings is more preferably used than the transparent electrode.

On the drive electrode E3, a transparent insulating film 9 is formed, and the electrode E1 is electrically and physically connected to the drive electrode E3, and has a large opening. The spatial light modulator SLM is provided inside the opening of the electrode E1. In this case, the row selection circuit DR1 and the column selection circuit are positioned outside the electrode E1, so that appropriate connection wiring is provided from these circuits to the pixel electrodes and the common electrode. The electrode E2 is configured to transmit a part or whole of a laser beam LB. For the electrode E2, the same structure as the drive electrode E3 can also be adopted.

Figure 2:
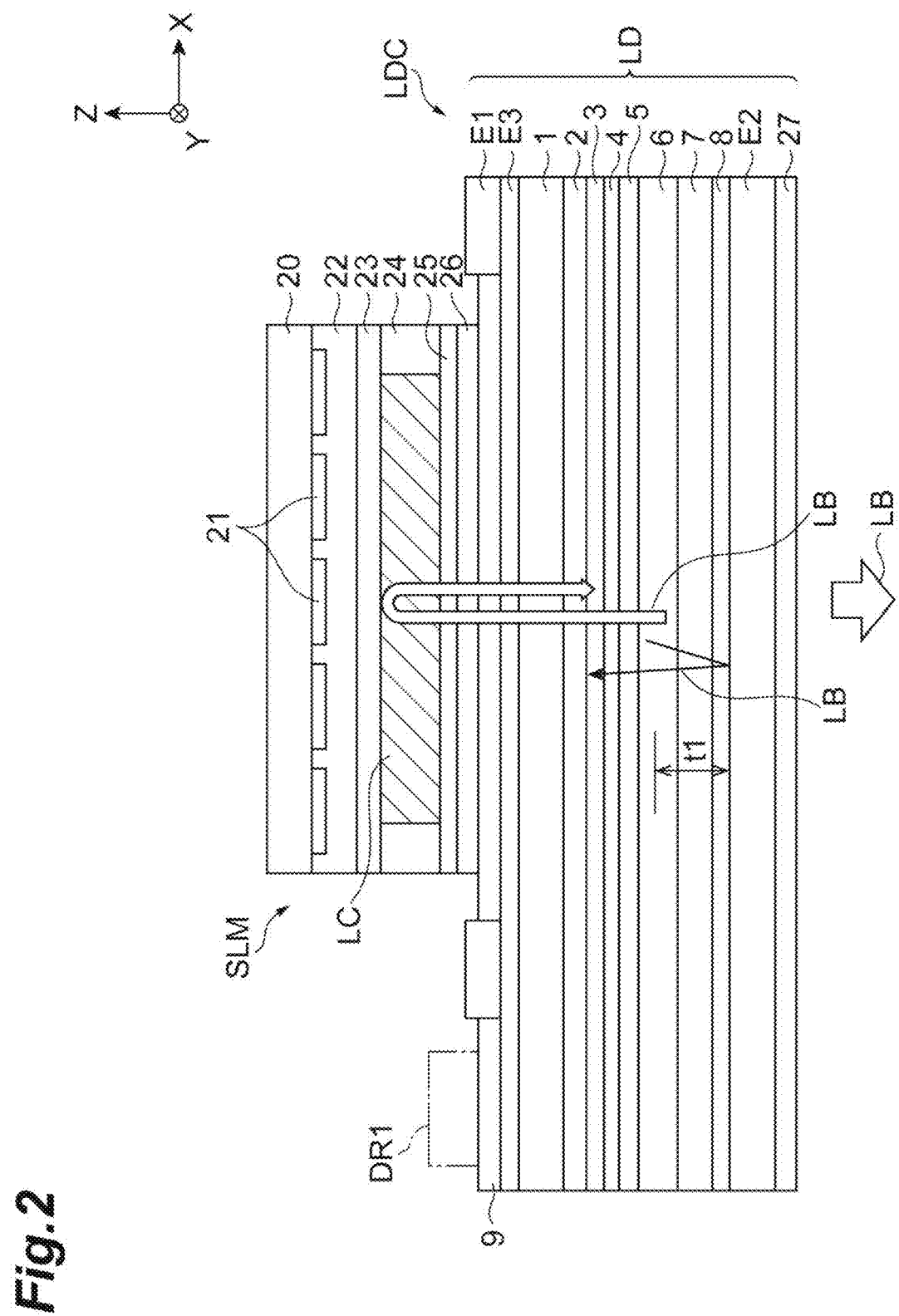
FIG. 2 is a longitudinal sectional view of a semiconductor laser device according to a second embodiment.

FIG. 2 is a longitudinal sectional view of a semiconductor laser device according to a second embodiment.

As compared with the first embodiment, the second embodiment is different from the first embodiment in that a quarter wavelength plate 26 and a polarizer 27 are used, and other components are the same.

The diffraction grating layer 6 has a structure in which, for example, triangular shapes are arranged in a square grid form, and diffracts linear polarized light in the vertical direction. When a polarization transmission axis of the linear polarized light to be output from the diffraction grating layer 6 at this time is defined as an axis A, a polarization transmission axis of the polarizer 27 is set in a direction (defined as axis B) orthogonal to the axis A. A fast axis of the quarter wavelength plate 26 is set in a direction rotated 45 degrees from the axis A. A laser beam that entered the spatial light modulator SLM via the quarter wavelength plate 26, reciprocated through the spatial light modulator SLM, and passed through the quarter wavelength plate 26 again in a reverse direction, rotates its polarization direction 90 degrees. That is, in a case where the laser beam LB as linear polarized light having a first polarization direction (axis A) enters the quarter wavelength plate 26, after passing through this wavelength plate twice, the laser beam LB becomes linear polarized light having a second polarization direction (axis B) rotated 90 degrees from the first polarization direction.

Therefore, by matching the polarization direction on the polarizer 27 with the second polarization direction (axis B), only a laser beam that reciprocated through the spatial light modulator SLM is transmitted through the polarizer 27, and components in the other polarization directions are blocked by the polarizer 27. Therefore, noise components that were not modulated by the liquid crystal layer LC are removed from an output image, and the contrast of the image is improved. The positions of the common electrode 25 and the quarter wavelength plate 26 can be switched.

Figure 22:
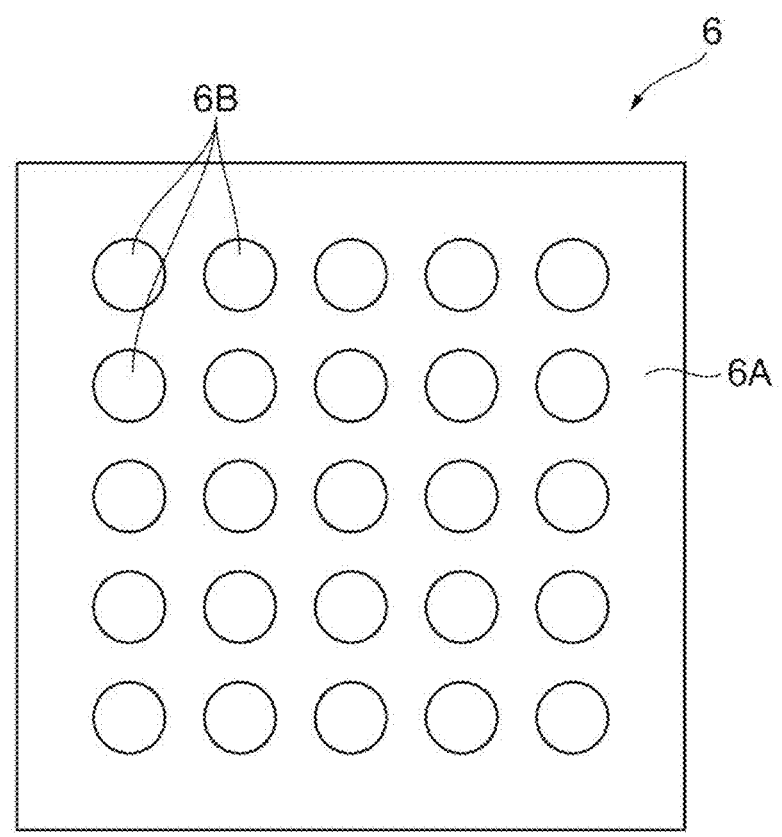
FIG. 22 is a plan view of a diffractive grating layer.

FIG. 22 is a plan view of the diffraction grating layer.

The above-described diffraction grating layer 6 includes, for example, a basic layer 6A and different refractive index regions 6B. The different refractive index regions 6B are embedded to a predetermined depth inside the basic layer 6A, and are different in refractive index from the basic layer. The different refractive index region 6B having a circular planar shape is shown, however, the planar shape may be other shapes such as triangular or oval. For example, in order to increase an intensity in a specific polarization direction, the planar shape may be set so as not to have rotational symmetry at 80 degrees. To obtain linearly polarized light, this planar shape may be set to, for example, an isosceles triangle, a right triangle, or an isosceles right triangle. The different refractive index regions 6B are disposed at grid points of a square grid, however, they may be disposed at grid points of a triangular grid. The diffraction grating layer 6 has a periodic structure that two-dimensionally changes in refractive index due to embedded different refractive index regions, and therefore, functions as a diffraction grating, and also functions as a photonic crystal layer. In the same figure, a periodic structure including perfect circular holes arranged in a square grid form is used, however, a periodic structure including triangular holes arranged in a square grid form can also be used, and the semiconductor laser element functions as a surface-emitting laser.

Materials of the above-described laser elements are described below.

As an example of materials of the semiconductor laser element constituting the laser beam generating region LD, the semiconductor substrate 1 is made of GaAs, the lower cladding layer 2 is made of AlGaAs, the lower light guide layer 3 is made of AlGaAs, the active layer 4 is formed of a multiquantum well structure MQW (barrier layer: AlGaAs, well layer: InGaAs), the upper light guide layer 5 consists of a lower layer made of AlGaAs and an upper layer made of GaAs, the upper cladding layer 7 is made of AlGaAs, and the contact layer 8 is made of GaAs. In the diffraction grating layer (phase modulation layer, refractive index modulation layer) 6, the basic layer 6A is made of GaAs, and the different refractive index regions (embedded layers) 6B embedded in the basic layer 6A are made of AlGaAs.

The respective layers are doped with a first conductivity type (N type) impurity or a second conductivity type (P type) impurity (impurity concentration is $1 \times 10^{17}$ to $1 \times 10^{21}/cm^3$), the semiconductor substrate 1 can be made as an N type, the lower cladding layer 2 can be made as an N type, the lower light guide layer 3 can be made as an I type, the active layer 4 can be made as an I type, and the lower layer of the upper light guide layer 5 can be made as a P or I type, the upper layer thereof can be made as an I type, the diffraction grating layer 6 can be made as an I type, the upper cladding layer 7 can be made as a P type, and the contact layer 8 can be made as a P type. A region that is not intentionally doped with any impurity is intrinsic (I type). An impurity concentration of I type is not more than $1 \times 10^{16}/cm^3$.

For example, a thickness of the semiconductor substrate 1 can be set to 150 μm (80 μm to 350 μm), a thickness of the lower cladding layer 2 can be set to $2 \times 10^3$ nm ($1 \times 10^3$ nm to $3 \times 10^3$ nm), a thickness of the lower light guide layer 3 can be set to 150 nm (0 to 300 nm), a thickness of the active layer 4 can be set to 30 nm (10 nm to 100 nm), a thickness of the lower layer of the upper light guide layer 5 can be set to 50 nm (10 nm to 100 nm), a thickness of the upper layer thereof can be set to 50 nm (10 nm to 200 nm), a thickness of the diffraction grating layer 6 can be set to 100 nm (50 nm to 200 nm), a thickness of the upper cladding layer 7 can be set to $2 \times 10^3$ m ($1 \times 10^3$ nm to $3 \times 10^3$ nm), and a thickness of the contact layer 8 can be set to 200 nm (50 nm to 500 nm). The values in parentheses are preferable values.

An energy bandgap of the cladding layer is set to be larger than an energy bandgap of the light guide layer, and an energy bandgap of the light guide layer is set to be larger than an energy bandgap of the well layer of the active layer 4. In AlGaAs, by changing a composition ratio of Al, the energy bandgap and the refractive index can be easily changed. In $Al_XGa_{1-X}As$, when the composition ratio X of Al with a relatively small atomic radius is reduced (increased), an energy bandgap having a positive correlation with the Al composition ratio becomes smaller (larger), and when InGaAs is made by mixing In with a large atomic radius in GaAs, the energy bandgap becomes smaller. That is, the Al composition ratio of the cladding layer Al is larger than the Al composition ratio of the light guide layer, and the Al composition ratio of the light guide layer is equivalent to or larger than that of the barrier layer (AlGaAs) of the active layer. The Al composition ratio of the cladding layer is set to 0.2 to 0.4, and in this example, set to 0.3. The Al composition ratios of the barrier layers in the light guide layer and the active layer are set to 0.1 to 0.15, and in this example, set to 0.1. In order to prevent electrons from leaking from the active layer, a layer with a thickness of approximately 10 to 100 nm having an Al composition equivalent to that of the cladding layer may be inserted between the guide layer and the second conductivity type (p type) cladding layer.

It is also possible that the columnar different refractive index regions in the diffraction grating layer 6 are changed into voids, and air or a gas such as nitrogen or argon may be sealed therein. In the diffraction grating layer 6, the different refractive index regions 6B are disposed at grid points of a square grid or triangular grid within an XY plane. Intervals of longitudinal and transverse grid lines in this square grid are set to approximately a value obtained by dividing a laser beam wavelength by an equivalent refractive index, and in detail, preferably set to approximately 300 nm. The different refractive index regions may be disposed not at the grid points of the square grid but at grid points of a triangular gird. Intervals of transverse and diagonal grid lines of the triangular grid are set to approximately a value obtained by dividing a wavelength by an equivalent refractive index and further dividing by Sin 60°, in detail, preferably set to 350 nm.

In the case of a square grid with a grid interval a, when unit vectors of an orthogonal coordinate system are x and y, primitive translation vectors $a_1=ax$, $a_2=ay$, and primitive reciprocal lattice vectors with respect to the primitive translation vectors $a_1$ and $a_2$ are $b_1=(2\pi/a)y$, $b_2=(2\pi/a)x$. When the Γ point in a photonic band of a photonic crystal, that is, wave vector $k=nb_1+mb_2$ (n and m are arbitrary integers), a resonant mode (standing wave within XY plane) in which the grating interval a is equal to the wavelength λ is obtained.

When the above-described common electrode and pixel electrodes are transparent, they are made of ITO or ZnO. These materials are transparent with respect to a laser beam, and can transmit a laser beam.

The above-described reflection coating 23 is made of a single-layer or multi-layer mirror of a metal such as aluminum, and the multi-layer mirror is formed by alternately laminating a high-refractive index material layer (=nH) and a low-refractive index material layer (=nL) with a low refractive index relative to that of the high-refractive index material layer. A material of the high-refractive index material layer (nH) includes at least one material (for example, $Ta_2O_5$) selected from an oxide group (insulator group) consisting of $Ta_2O_5$, $TiO_2$, $Nb_2O_5$, and $HfO_2$, etc. A material of the low-refractive index material layer (nL) includes at least one material (for example, $SiO_2$) selected from an insulator group consisting of $SiO_2$ and $MgF_2$, etc. Respective optical film thicknesses of the high-refractive index material layer (nH) and the low-refractive index material layer (nL) are set to ¼ of a wavelength λ, of the laser beam. As a lamination structure of these dielectric layers, the following kinds are possible.

(1): A first structure is a structure obtained by laminating m times a pair (=A) of the low-refractive index material layer (nL) and a high-refractive index material layer (nH), and in this case, a total number of layers is 2×A×m. m is a natural number. The lowermost layer is a low-refractive index material layer (nL).

(2): A second structure is a structure obtained by laminating m times the above-described pair (A) and then further laminating a low-refractive index material layer (nL) on the uppermost high-refractive index material layer (nH), and in this case, a total number of layers is 2×A×m+1.

(3): A structure obtained by, in the above-described structure (1) or (2), switching the positions of the high-refractive index material layers (nH) and the low-refractive index material layers (nL), can also be adopted. In the case of the structure (3), the lowermost layer is a high-refractive index material layer (nH).

Last, the above-described semiconductor laser element is described briefly.

In manufacturing of the semiconductor laser element, metalorganic chemical vapor deposition is used for each compound semiconductor layer. Crystal growth on the surface (001) of the semiconductor substrate 1 is performed, however, the method is not limited to this. In manufacturing of a laser element using AlGaAs, a growth temperature of AlGaAs is 500° C. to 850° C., and in the experiment, a temperature between 550° C. and 700° C. is adopted, and at the time of growth, TMA (trimethylaluminum) is used as an Al material, TMG (trimethylgallium) and TEG (triethylgallium) are used as gallium materials, $AsH_3$ (arsine) is used as an As material, $Si_2H_6$ (disilane) is used as a material for N type impurity, and DEZn (diethyl zinc) is used as a material for P type impurity. For growth of AlGaAs, TMA, TMG, and arsine are used, and for growth of GaAs, TMG and arsine are used, however, TMA is not used. InGaAs is produced by using TMG, TMI (trimethylindium), and arsine. An insulating film may be formed by using a constitutive substance of the insulating film as a material and sputtering the constitutive substance on a target.

That is, in order to manufacture the semiconductor laser element, first, after the N type cladding layer (AlGaAs) 2 is formed on the N type semiconductor substrate (GaAs) 1, the light guide layer (AlGaAs) 3, the multiquantum well structure (InGaAs/AlGaAs) 4, and the light guide layer (GaAs/AaGaAs) 5 are formed, and subsequently, the basic layer (GaAs) 6A serving as a photonic crystal layer is epitaxially grown by MOCVD (metalorganic chemical vapor deposition).

Next, for alignment after epitaxial growth, by PCVD (plasma CVD), an SiN layer is formed on the basic layer 6A, and then, a resist is formed on the SiN layer. Further, the resist is exposed and developed, and the SiN layer is etched by using the resist as a mask, and an alignment mark is formed by partially leaving the SiN layer. The resist residue is removed.

Next, another resist is applied to the basic layer 6A, and based on the alignment mark, a two-dimensional fine pattern is drawn on the resist with an electron beam lithography device and developed to form a two-dimensional fine pattern on the resist. Thereafter, by using the resist as a mask, a two-dimensional fine pattern with a depth of approximately 100 nm is transferred onto the basic layer 6A by dry-etching, holes are formed, and the resist is removed. The depth of the holes is 100 nm. In the holes, a compound semiconductor that becomes different refractive index regions 6B (AlGaAs) is re-grown to be deeper than the depth of the holes. Next, the upper cladding layer (AlGaAs) 7 and the contact layer (GaAs) 8 are successively formed by MOCVD, and an appropriate electrode material is formed on upper and lower surfaces of the substrate by vapor-deposition or sputtering to form first and second electrodes. In addition, insulating films can be formed on upper and lower surfaces of the substrate by sputtering or the like when necessary.

In the case where the diffraction grating layer 6 is provided under the active layer, before forming the active layer and the lower light guide layer, the diffraction grating layer is formed on the lower cladding layer.

In the case of the structure shown in FIG. 2, the quarter wavelength plate 26 is disposed on the semiconductor substrate 1 via the insulating film 9, and the polarizer 27 is disposed on a surface of the contact layer 8. In the case where the drive electrode E3 is formed on the semiconductor substrate 1, patterning on the semiconductor substrate 1 is performed by using photolithography.

As described above, with the above-described device, light generated in the active layer is modulated by the diffraction grating layer, oscillates in a two-dimensional single mode, and a part of the oscillating light is subjected to second-order diffraction by the diffraction grating layer, and enters as a planar wave the liquid crystal layer. The liquid crystal has diffractive index anisotropy, so that in response to a rotation angle thereof, an equivalent refractive index in a direction, parallel to an optical output changes. At this time, a physical length of the liquid crystal layer is fixed, so that due to the change in refractive index, an optical path length changes. Therefore, when a planar wave is made incident on the liquid crystal layer from a lower portion, its optical path length can be changed for each pixel. In other words, when a planar wave is made incident on the liquid crystal layer from a lower portion, its phase can be changed for each pixel, so that a shape of an outgoing wavefront can be controlled. Thus, a laser beam that oscillates in a two-dimensional single mode enters as a planar wave the liquid crystal layer, and a wavefront whose phase is modulated for each pixel can be obtained as an optical output from the lower portion.

Next, the drive electrode E3 is described.

Figure 3:
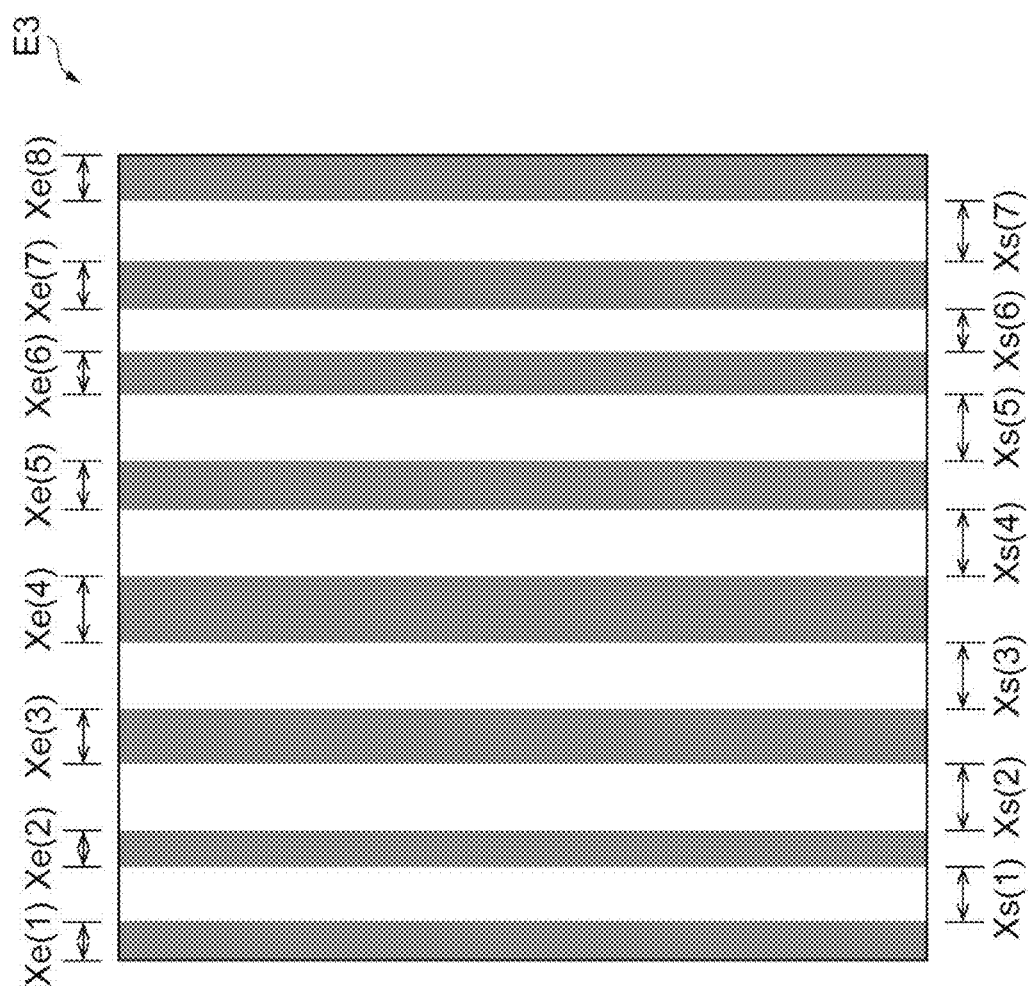
FIG. 3 is a plan view of a drive electrode.

FIG. 3 is a plan view of a drive electrode E3.

The drive electrode E3 includes a plurality of conductive regions (black regions) linearly extending along the first direction within the XY plane, and when widths of the conductive regions in the X-axis direction are Xe, intervals between the conductive regions in the X-axis direction are Xs, N is an integer, a width Xe of the conductive region positioned N-th along the X-axis direction is Xe(N), and an interval Xs positioned N-th along the X-axis direction is Xs(N), the widths Xe are not periodic, Xe(N) and Xe(N+1) are different from each other, the intervals Xs are not periodic, and Xs(N) and Xs(N+1) are different from each other.

In the same figure, the widths Xe(1) to Xe(8) and the intervals Xs(1) to Xs(7) in the case of N=1 to 8 are shown, and for the sake of convenience, each conductive region is shown by the same reference sign as that of its width. For example, between adjacent conductive regions (Xe(1) and Xe(2)), an interval Xs(1) (N=1, N+2=2) as a gap is positioned.

In this example, since the widths Xe of the conductive regions are not periodic, laser beams reflected thereon are prevented from interfering with each other and causing generation of noise light, and since the intervals Xs between the conductive regions that define openings are not periodic, laser beams transmitted through the openings are prevented from interfering with each other and causing generation of noise light.

The longitudinal direction of each conductive region is in the Y-axis direction, and extends along the Y-axis direction.

In the same figure, the conductive regions linearly extend, so that manufacturing thereof is easy, and the opening ratio can be increased.

Figure 4:
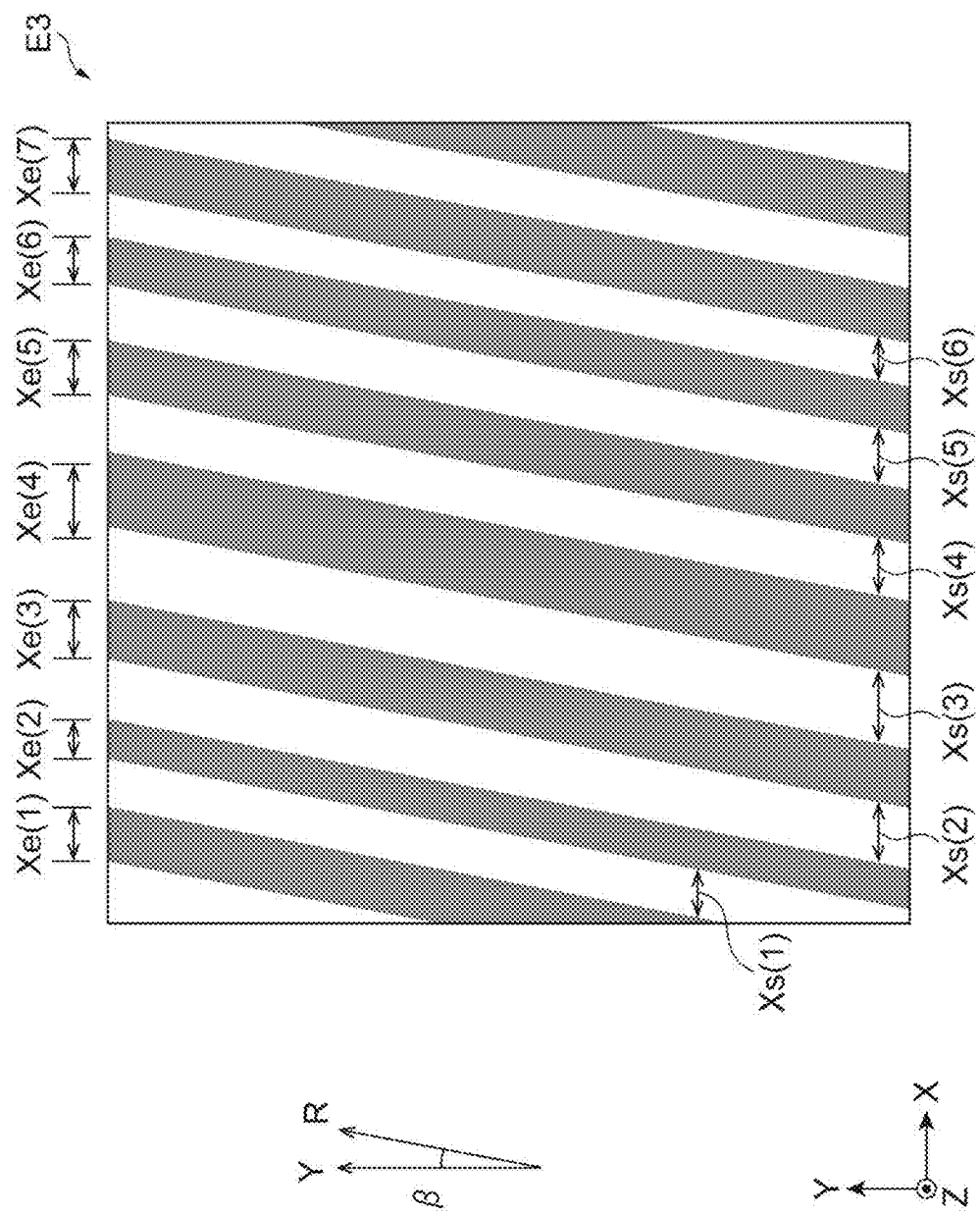
FIG. 4 is a plan view of a drive electrode.

FIG. 4 is a plan view of a drive electrode E3.

A shape of the semiconductor laser chip within the XY plane is rectangular, and when a direction parallel to one side of the rectangle is set as a Y axis, an angle β between the extending direction of the drive electrode (first direction R) and the Y axis is 0 degrees in the case of FIG. 3, however, in the case of FIG. 4, the drive electrode has a linear stripe form as in the case of FIG. 3, and satisfies β≠n×90° (n: arbitrary integer). In the case of β≠n×90° (n: arbitrary integer), it brings about an effect that manufacturing is easy, however, basically, β can be set to an arbitrary angle.

Figure 5:
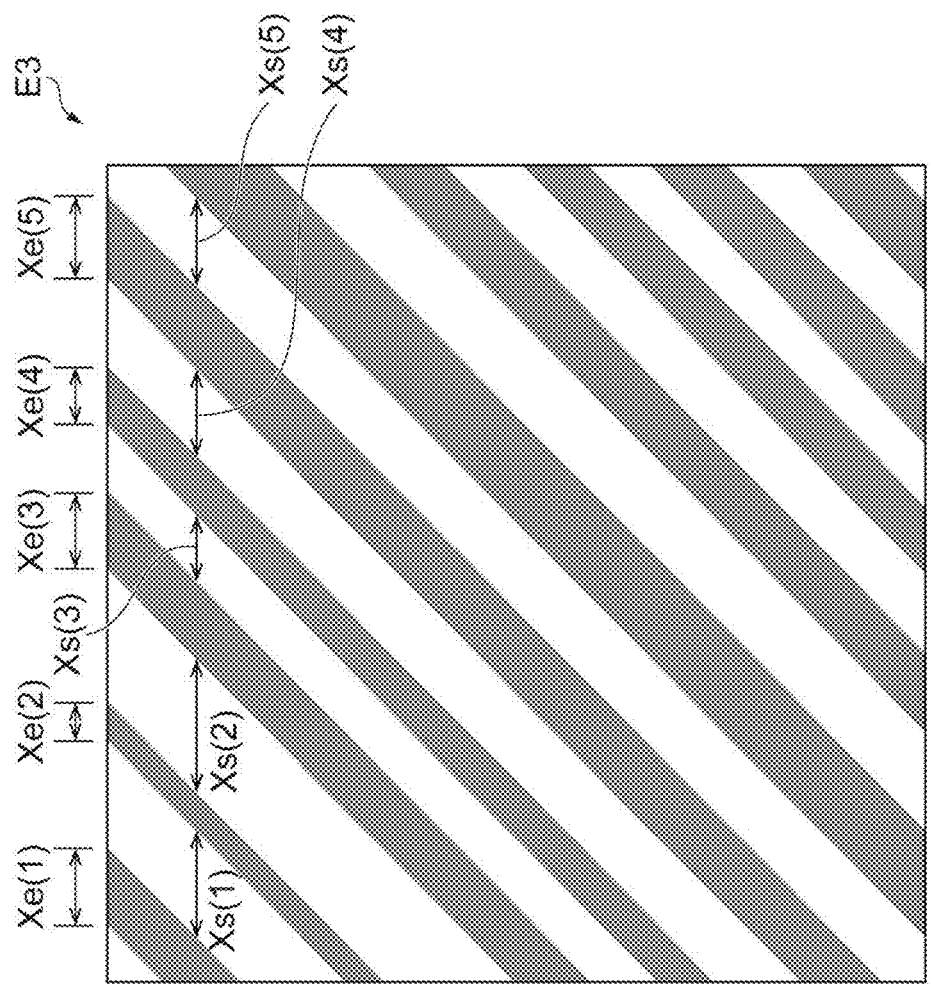
FIG. 5 is a plan view of a drive electrode.

FIG. 5 is a plan view of a drive electrode E3.

A shape of the semiconductor laser chip within the XY plane is rectangular, and when a direction parallel to one side of the rectangle is set as a Y axis, an angle β between the extending direction of the drive electrode (first direction R) and the Y axis satisfies β≠n×90° (n: arbitrary integer) in the case of FIG. 5 in which the drive electrode has a linear stripe form as in the case of FIG. 3.

As described above, basically, β can be set to an arbitrary angle.

Figure 6:
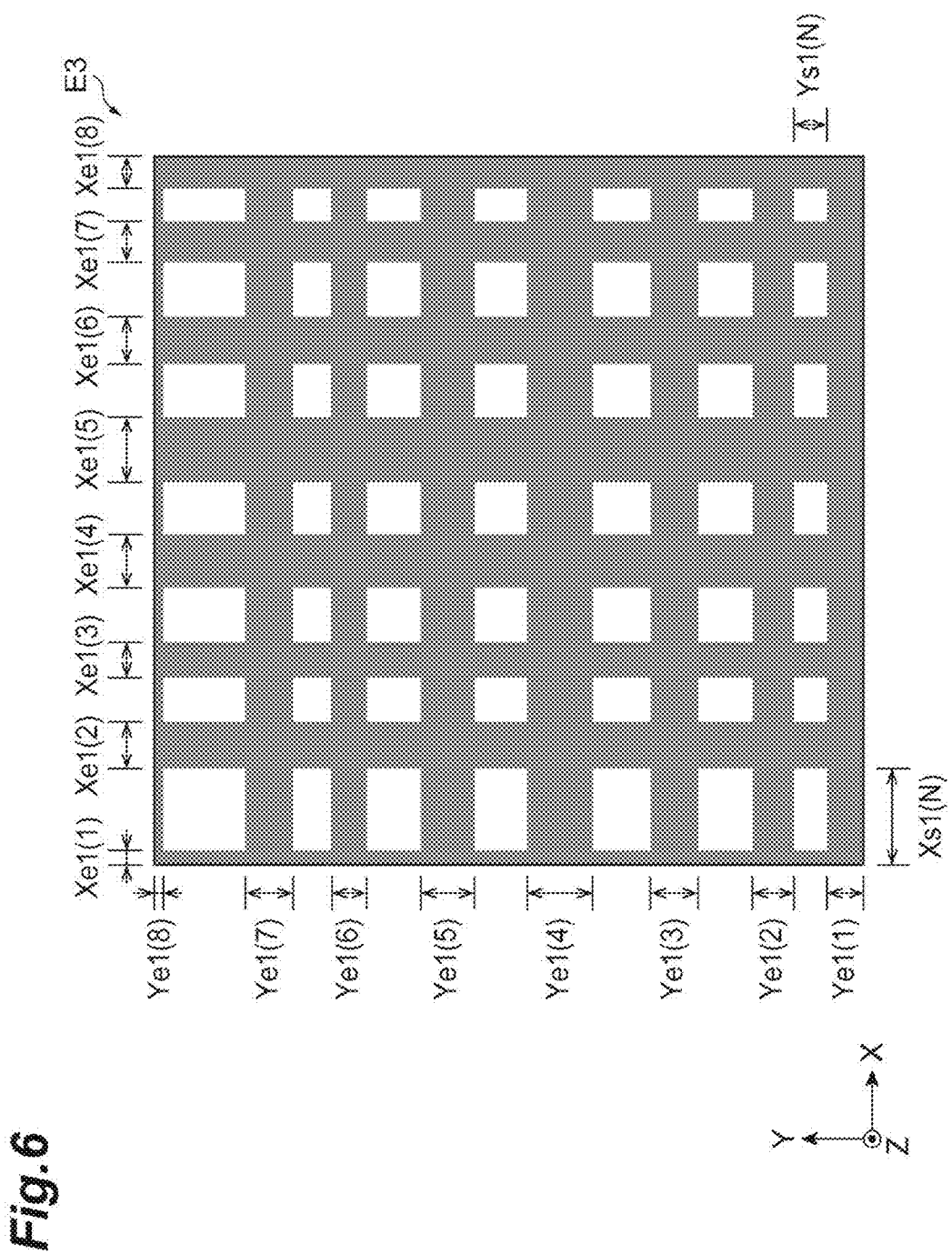
FIG. 6 is a plan view of a drive electrode.

FIG. 6 is a plan view of a drive electrode E3.

The drive electrode E3 has a shape in which a plurality of first conductive regions (Xe1(1) to Xe1(8)) extending along a first direction (Y axis in this example) and a plurality of second conductive regions (Ye1(1) to Ye1(8)) extending along a second direction (X axis in this example) different from the first direction overlap each other so as to form a plurality of openings that are two-dimensionally positioned within the XY plane.

Widths of the first conductive regions in the X-axis direction are Xe1, intervals between the first conductive regions in the X-axis direction are Xs1, N is an integer, a width Xe1 of the first conductive region positioned N-th along the X-axis direction is Xe1(N), and an interval Xs1 positioned N-th along the X-axis direction is Xs1(N). The widths Xe1 are not periodic, Xe1(N) and Xe1(N+1) are different from each other, the intervals Xs1 are not periodic, and Xs1(N) and Xs1(N+1) are different from each other.

Similarly, widths of the second conductive regions in the Y-axis direction are Ye1, intervals between the second conductive regions in the Y-axis direction are Ys1, N is an integer, a width Ye1 of the second conductive region positioned N-th along the Y-axis direction is Ye1(N), and an interval Xs1 positioned N-th along the Y-axis direction is Ys1(N). The widths Ye1 are not periodic, Ye1(N) and Ye1(N+1) are different from each other, the intervals Ys1 are not periodic, and Ys1(N) and Ys1(N+1) are different from each other.

Also in this case, the same noise light prevention effect as described above is obtained, and the second conductive regions are present, so that the resistance of the drive electrode can be reduced as a whole, and a drive current can be efficiently supplied to the active layer.

Each conductive region can extend linearly or in a curve.

Figure 7:
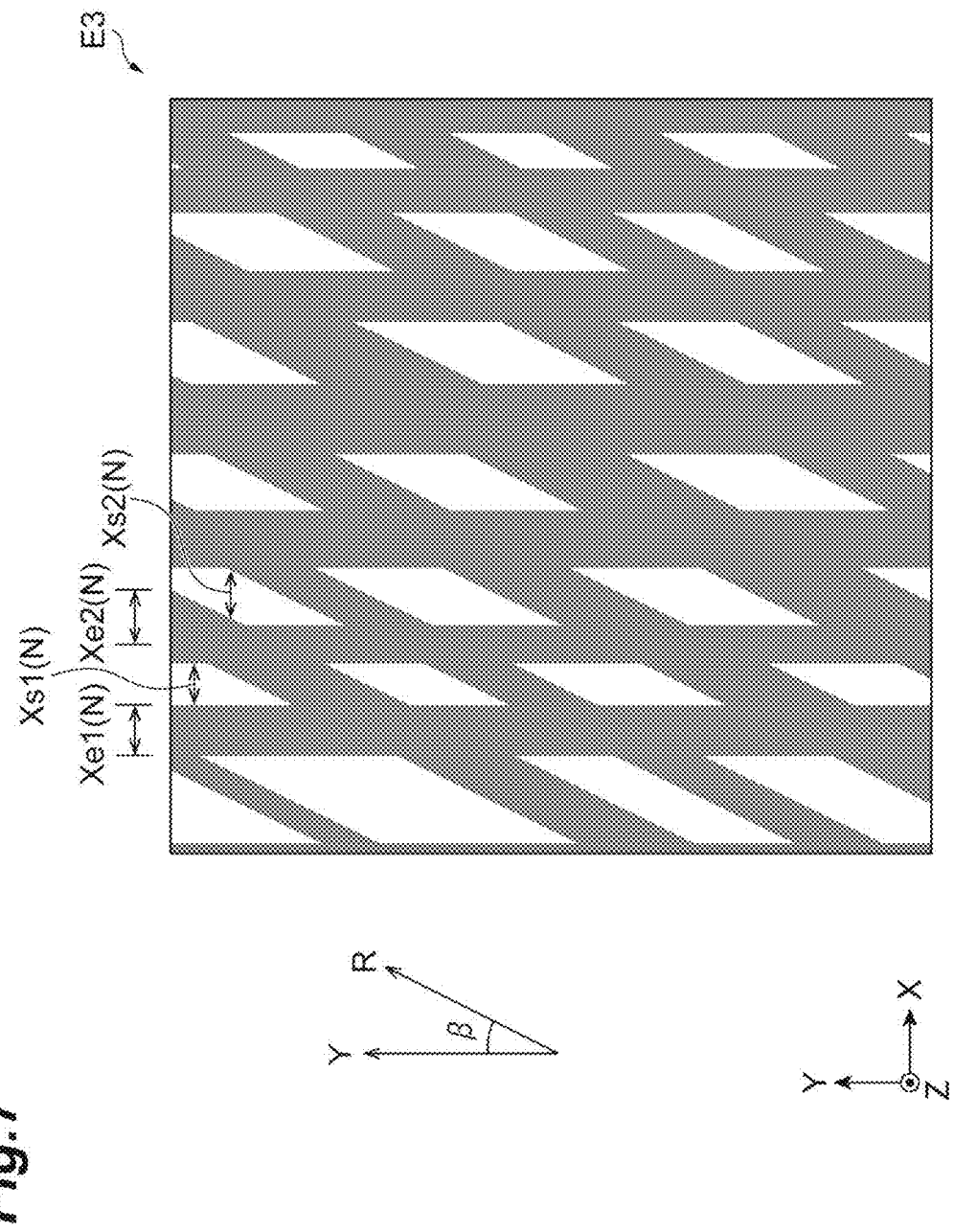
FIG. 7 is a plan view of a drive electrode.

FIG. 7 is a plan view of a drive electrode E3.

The drive electrode E3 has a shape in which a plurality of first conductive regions (Xe(N)) linearly extending along a first direction (Y axis in this example) and a plurality of second conductive regions (Xe2(N)) linearly extending along a second direction (direction R at an angle β with the Y axis) different from the first direction overlap so as to form a plurality of openings that are two-dimensionally positioned within the XY plane.

Widths of the first conductive regions in the X-axis direction are Xe1, intervals between the first conductive regions in the X-axis direction are Xs1, N is an integer, a width Xe1 of the first conductive region positioned N-th along the X-axis direction is Xe1(N), and an interval Xs1 positioned N-th along the X-axis direction is Xs1(N). The widths Xe1 are not periodic, Xe1(N) and Xe1(N+1) are different from each other, the intervals Xs1 are not periodic, and Xs1(N) and Xs1(N+1) are different from each other.

Similarly, widths of the second conductive regions in the X-axis direction are Xe2, intervals between the second conductive regions in the X-axis direction are Xs2, N is an integer, a width Xe2 of the second conductive region positioned N-th along the X-axis direction is Xe2(N), and an interval Xs2 positioned N-th along the X-axis direction is Xs2(N). The widths Xe2 are not periodic, Xe2(N) and Xe2(N+1) are different from each other, the intervals Xs2 are not periodic, and Xs2(N) and Xs2(N+1) are different from each other.

Also in this case, the same noise light prevention effect as described above is obtained, and the second conductive regions are present, so that the resistance of the drive electrode can be reduced as a whole, and a drive current can be efficiently supplied to the active layer.

Figure 8:
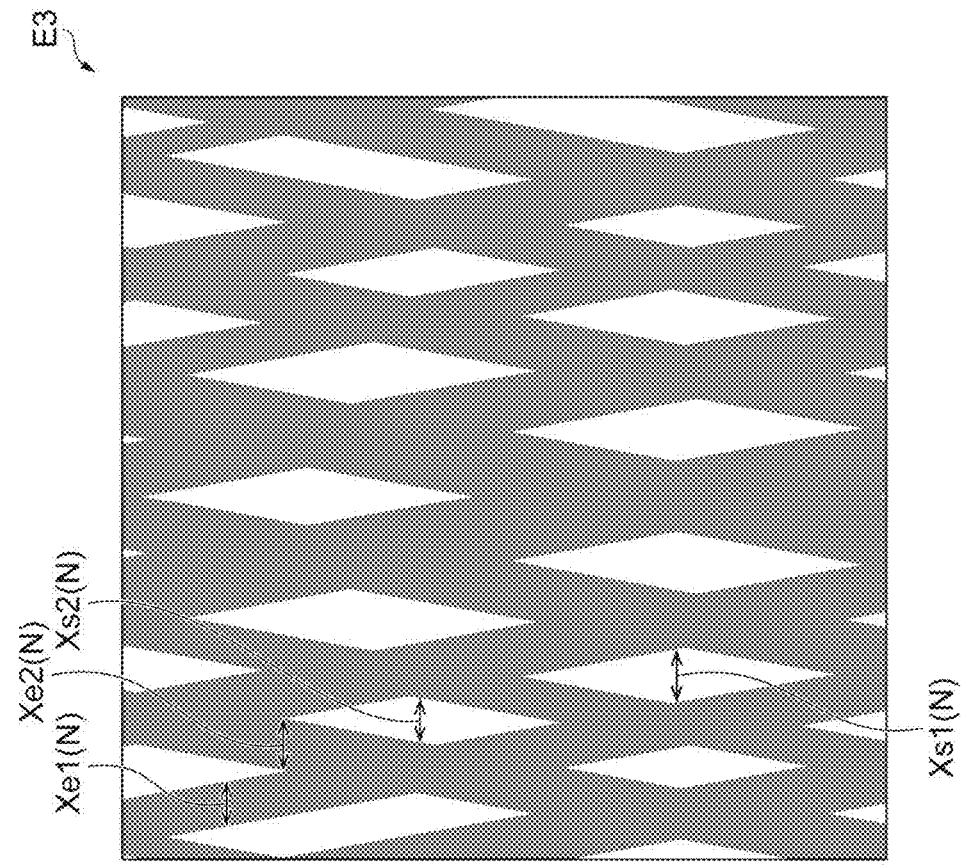
FIG. 8 is a plan view of a drive electrode.

FIG. 8 is a plan view of a drive electrode E3.

The drive current E3 has a shape in which a plurality of first conductive regions (Xe(N)) linearly extending along a first direction (direction R1 at an angle β1 with the Y axis in this example) and a plurality of second conductive regions (Xe2(N)) linearly extending along a second direction (direction R2 at an angle β2 with the Y axis) different from the first direction overlap so as to form a plurality of openings that are two-dimensionally positioned within the XY plane.

Widths of the first conductive regions in the X-axis direction are Xe1, intervals between the first conductive regions in the X-axis direction are Xs1, N is an integer, a width Xe1 of the first conductive region positioned N-th along the X-axis direction is Xe1(N), and an interval Xs1 positioned N-th along the X-axis direction is Xs1(N). The widths Xe1 are not periodic, Xe1(N) and Xe1(N+1) are different from each other, the intervals Xs1 are not periodic, and Xs1(N) and Xs1(N+1) are different from each other.

Similarly, widths of the second conductive regions in the X-axis direction are Xe2, intervals between the second conductive regions in the X-axis direction are Xs2, N is an integer, a width Xe2 of the second conductive region positioned N-th along the X-axis direction is Xe2(N), and an interval Xs2 positioned N-th along the X-axis direction is Xs2(N). The widths Xe2 are not periodic, Xe2(N) and Xe2(N+1) are different from each other, the intervals Xs2 are not periodic, and Xs2(N) and Xs2(N+1) are different from each other.

Also in this case, the same noise light prevention effect as described above is obtained, and the second conductive regions are present, so that the resistance of the drive electrode can be reduced as a whole, and a drive current can be efficiently supplied to the active layer.

Figure 9:
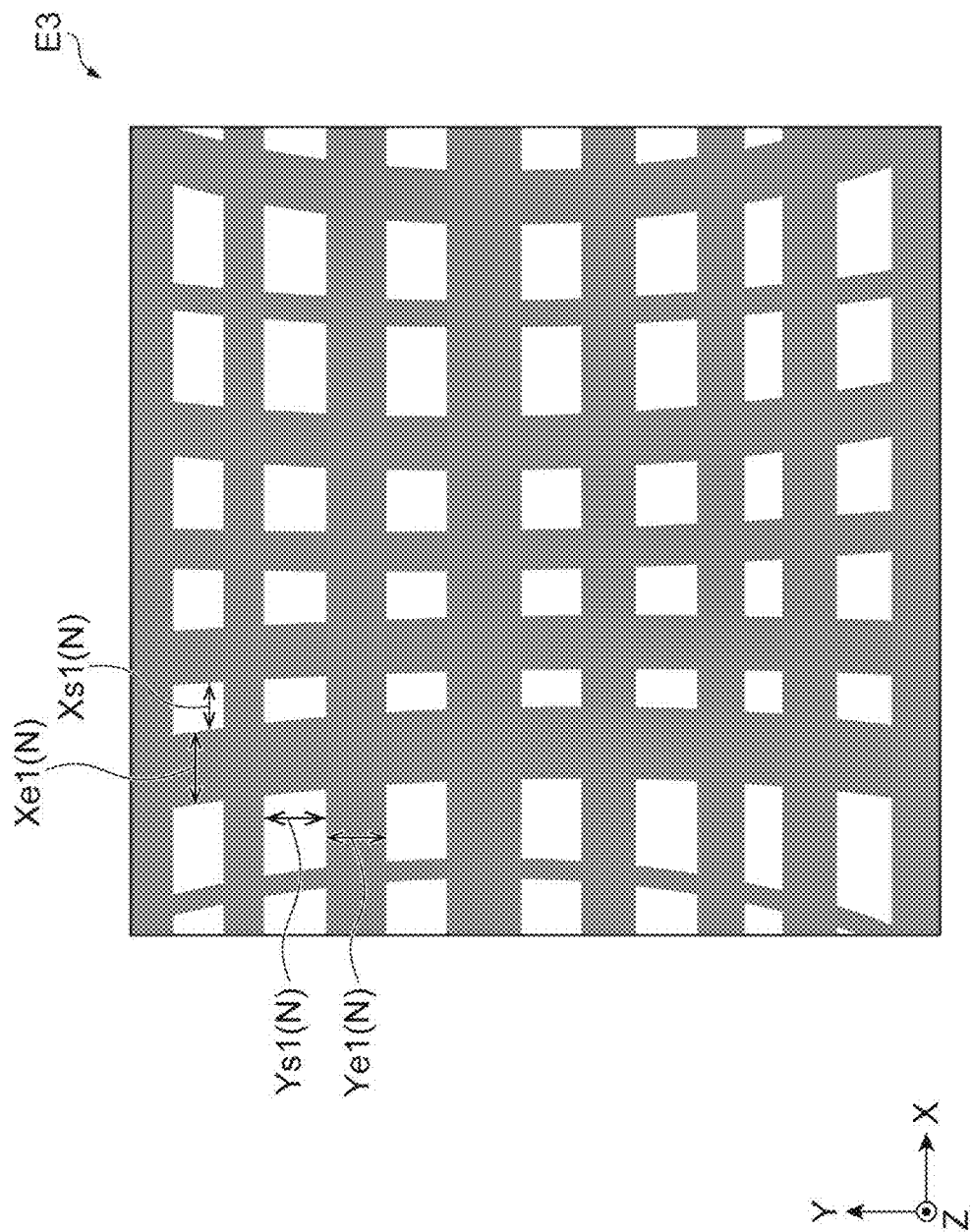
FIG. 9 is a plan view of a drive electrode.

FIG. 9 is a plan view of a drive electrode E3.

In this example, the first conductive regions shown in FIG. 6 are changed to be arc-shaped, and radiuses of curvature of adjacent regions are made different from each other, and other aspects are the same as in FIG. 6. That is, either the first conductive regions (Xe1(N)) or the second conductive regions (Ye1(N)) extend in arc shapes. It is also allowed that both of these extend in arc shapes.

In this case, as compared with the case where the conductive regions linearly extend, regularity among the conductive regions further deteriorates, so that the non-periodicity and randomness of the structure of the drive electrode are improved and noise light is further prevented, and the structure has an arc shape as a gentle continuous direction change, and this brings about an advantage that harmonic noise light to be caused by a rapid change in shape is also hardly generated.

Figure 10:
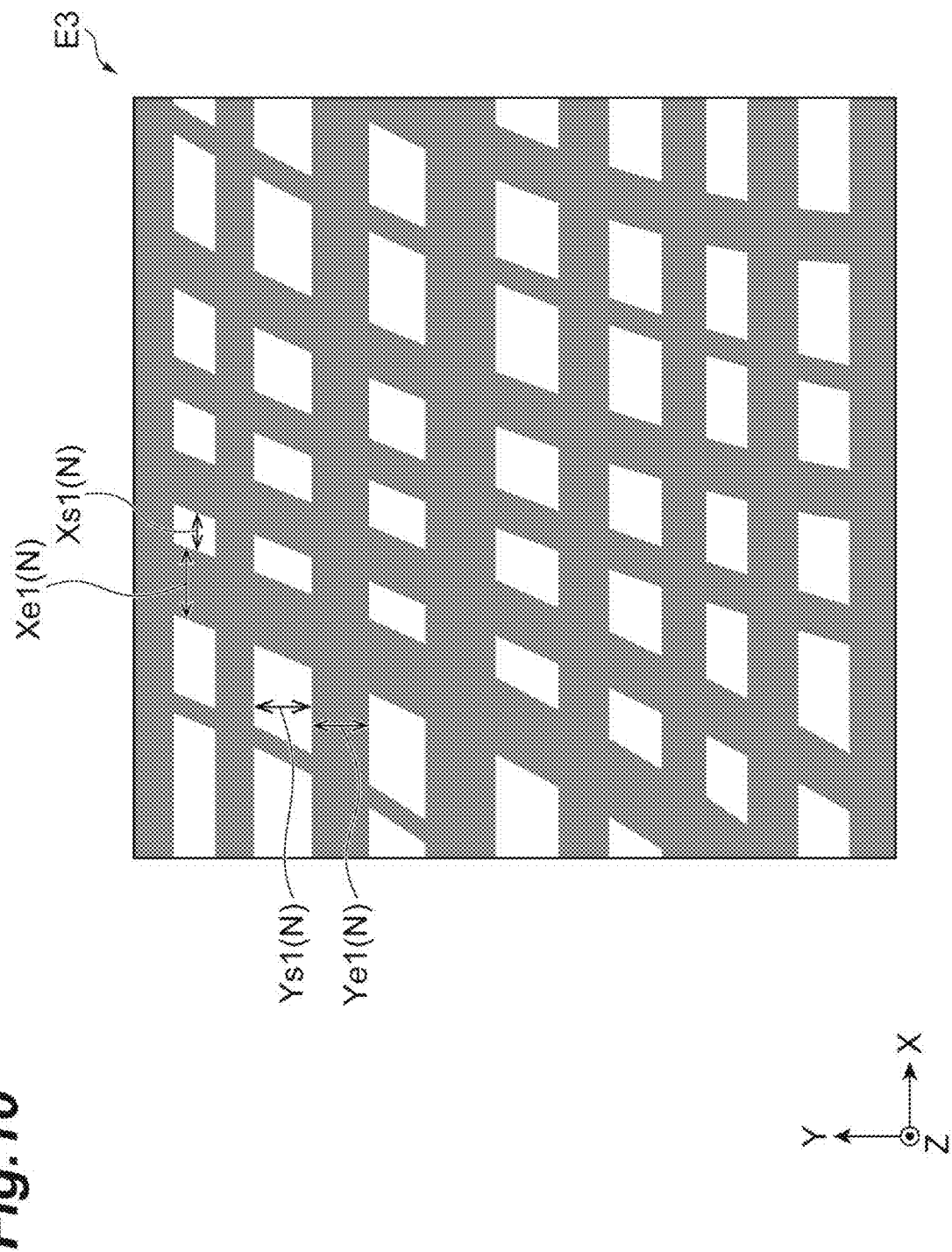
FIG. 10 is a plan view of a drive electrode.

FIG. 10 is a plan view of a drive electrode E3.

In this example, as compared with the example shown in FIG. 9, the first conductive regions extending longitudinally are changed to extend substantially diagonally with respect to the Y axis, and other aspects are the same as in FIG. 9. In this case, the same working effect as shown in FIG. 9 is obtained, and both end positions of each first conductive region along the Y-axis direction are displaced along the X-axis direction.

FIG. 11 is a plan view of a drive electrode E3.

In this example, as compared with the example shown in FIG. 8, the first conductive regions and second regions linearly extending are changed to be arc-shaped so as to have radiuses of curvature different from each other, and radiuses of curvature, widths, and intervals of the conductive regions adjacent to each other are all different from each other. Other aspects are the same as in FIG. 8. In this case, the same working effect as shown in FIG. 8 is obtained, and due to the arc shapes, as compared with the conductive regions linearly extending, regularity among the conductive regions further deteriorates, so that the non-periodicity and randomness of the structure of the drive electrode are improved and noise light is further prevented, and the structure has an arc shape as a gentle continuous direction change, so that harmonic noise light to be caused by a rapid change in shape is also hardly generated.

FIG. 12 is a plan view of a drive electrode E3.

In the semiconductor laser device, the drive electrode E3 has a shape in which a plurality of first conductive regions extending along a first direction (Y-axis direction), a plurality of second conductive regions extending along a second direction (direction R1 at an angle β1 with the Y axis in this example) different from the first direction, and a plurality of third conductive regions extending along a third direction (direction R2 at an angle β2 with the Y axis in this example) different from both of the first direction and the second direction overlap so as to form a plurality of openings that are two-dimensionally positioned within the XY plane. In the same figure, each conductive region linearly extends.

That is, the above-described openings are formed by being surrounded by the conductive regions extending in several directions, and it is also possible that the conductive regions extend in three or more directions. In the case where the conductive regions extend in more directions, randomness is improved, so that generation of noise light is expected to be further prevented.

FIG. 13 is a plan view of a drive electrode E3.

In the semiconductor laser device, the drive electrode E3 has a shape in which a plurality of first conductive regions extending along a first direction (Y-axis direction), a plurality of second conductive regions extending along a second direction (direction R1 at an angle β1 with the Y axis in this example) different from the first direction, and a plurality of third conductive regions extending along a third direction (direction R2 at an angle β2 with the Y axis in this example) different from both of the first direction and the second direction overlap so as to form a plurality of openings that are two-dimensionally positioned within the XY plane. In the same figure, the second conductive regions are almost along the direction R2, however, they extend not linearly but in arc shapes, and regularity of the openings deteriorates, so that generation of noise light is expected to be further prevented.

FIG. 14 is a plan view of a drive electrode E3.

In the semiconductor laser device, the drive electrode E3 has a shape in which a plurality of first conductive regions extending along a first direction (X axis in this example), a plurality of second conductive regions extending along a second direction (direction R1 at an angle α1 with the X axis in this example) different from the first direction, and a plurality of third conductive regions extending along a third direction (direction R2 at an angle α2 with the X axis in this example) different from both of the first direction and the second direction overlap so as to form a plurality of openings that are two-dimensionally positioned within the XY plane. In the same figure, all conductive regions extend not linearly but in arc shapes, and regularity of the openings deteriorates, so that generation of noise light is expected to be further prevented.

FIG. 15 is a plan view of a drive electrode E3.

A region in which the drive electrode E3 is provided includes a first region A1 in which a conductive region having a first non-periodic structure is formed and a second region A2 in which a conductive region having a second non-periodic structure different from the first non-periodic structure is formed. The first region A1 and the second region A2 have patterns different from each other, so that laser beams from these regions are prevented from interfering with each other and causing generation of noise light. The first region A1 is a region in which a value in the Y-axis direction is equal to or higher than a predetermined value, and the second region A2 is a region in which a value in the Y-axis direction is less than the predetermined value, and these regions are positioned one above the other. The predetermined value preferably deviates from a central value of a dimension in the Y-axis direction of the drive electrode forming region in terms of asymmetry for preventing interference, however, the predetermined value may be the central value.

Figure 16:
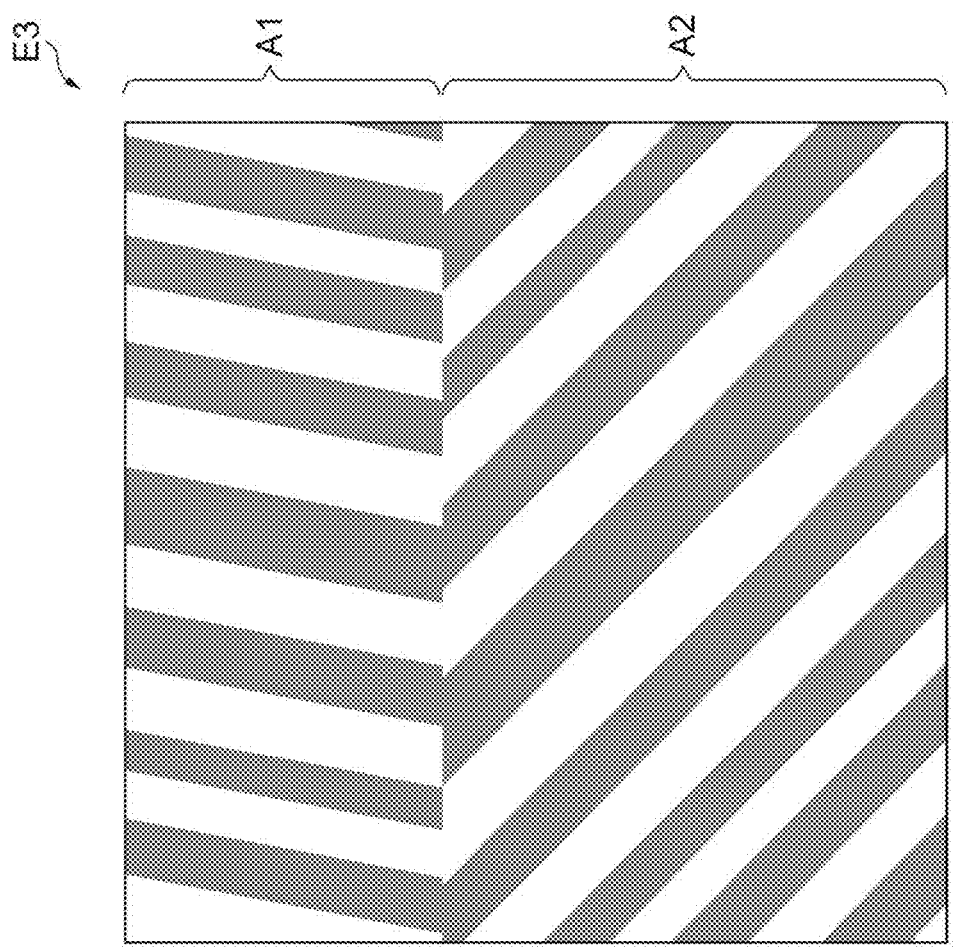
FIG. 16 is a plan view of a drive electrode.

FIG. 16 is a plan view of a drive electrode E3. In the first region A1 and the second region A2 shown in FIG. 15, the above-described various patterns can be disposed. That is, in this example, the pattern shown in FIG. 4 is disposed in the first region A1, and a mirror-reversed pattern of the pattern shown in FIG. 5 is disposed in the second region A2.

Figure 17:
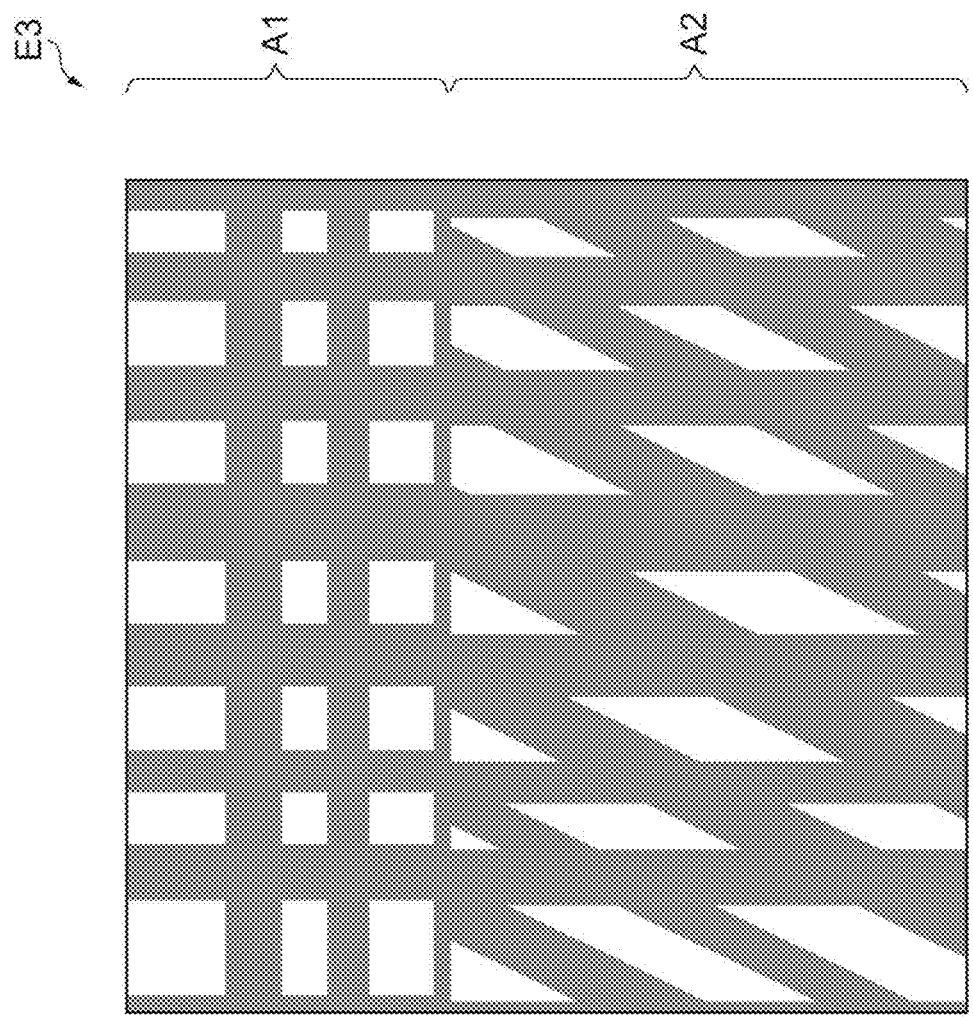
FIG. 17 is a plan view of a drive electrode.

FIG. 17 is a plan view of a drive electrode E3. This is an example in which the pattern shown in FIG. 6 is disposed in the first region A1, and the pattern shown in FIG. 7 is disposed in the second region A2.

FIG. 18 is a plan view of a drive electrode E3.

A region in which the drive electrode E3 is provided includes a first region A1 in which a conductive region having a first non-periodic structure is formed, and a second region A2 in which a conductive region having a second non-periodic structure different from the first non-periodic structure is formed. The first region A1 and the second region A2 have patterns different from each other, so that laser beams from these regions are prevented from interfering with each other and causing generation of noise light as a whole. The first region A1 is a region in which a value in the X-axis direction is less than a predetermined value, the second region A2 is a region in which a value in the X-axis direction is equal to or more than the predetermined value, and these regions are positioned side by side. The predetermined value may be a central value of a dimension in the X-axis direction of the drive electrode forming region, or may deviate from the central value.

Figure 19:
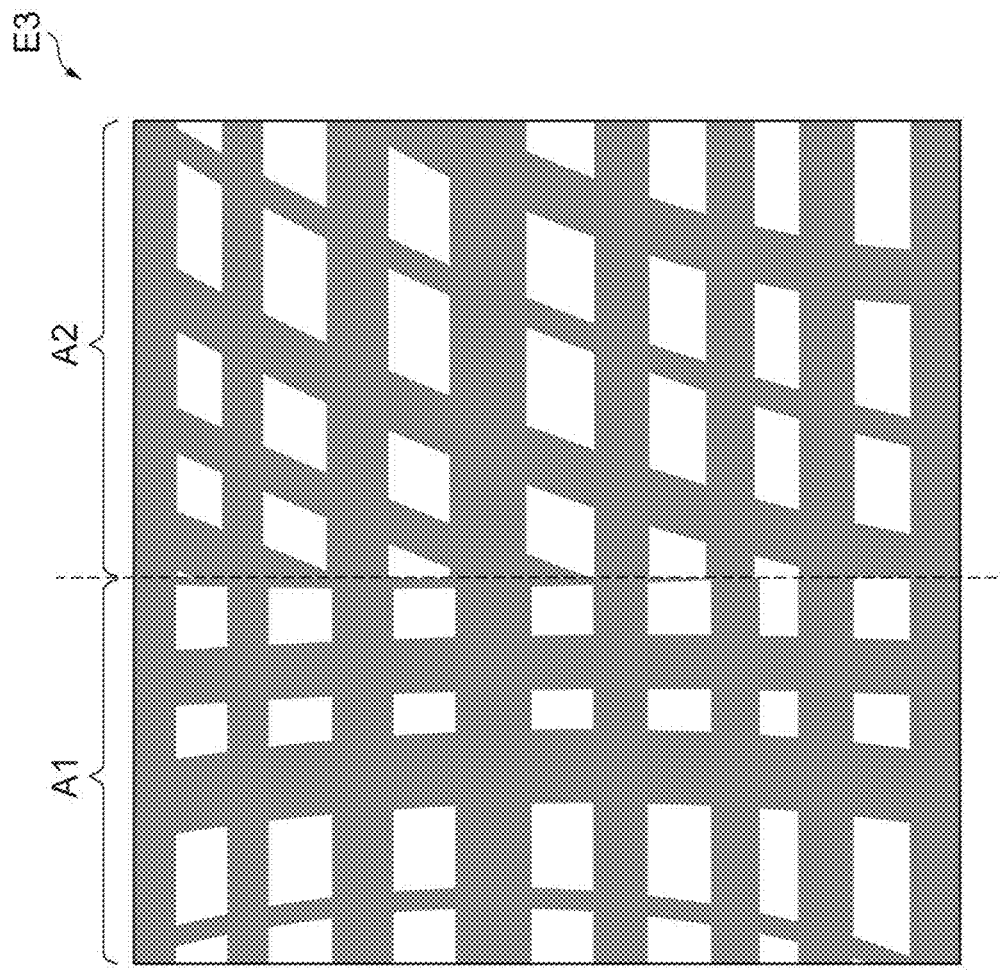
FIG. 19 is a plan view of a drive electrode.

FIG. 19 is a plan view of a drive electrode E. In the first region A1 and the second region A2 in FIG. 18, the above-described various patterns can be disposed. That is, in this example, the pattern shown in FIG. 9 is disposed in the first region A1, and the pattern shown in FIG. 10 is disposed in the second region A2.

FIG. 20 is a plan view of a drive electrode E3.

A region in which the drive electrode E3 is provided includes a first region A1 in which a conductive region having a first non-periodic structure is formed, a second region A2 in which a conductive region having a second non-periodic structure different from the first non-periodic structure is formed, and a third region A3 in which a conductive region having a third non-periodic structure different from both of the first and second non-periodic structures is formed. The first region A1, the second region A2, and the third region A3 have patterns different from each other, so that laser beams from these regions are prevented from interfering with each other and causing generation of noise light as a whole. The first region A1 is a region in which a value in the Y-axis direction is equal to or more than a first predetermined value, the second region is a region in which a value in the Y-axis direction is equal to or more than a second predetermined value and less than the first predetermined value, and the third region A3 is a region in which a value in the Y-axis direction is less than the first predetermined value. These regions are arrayed vertically.

Figure 21:
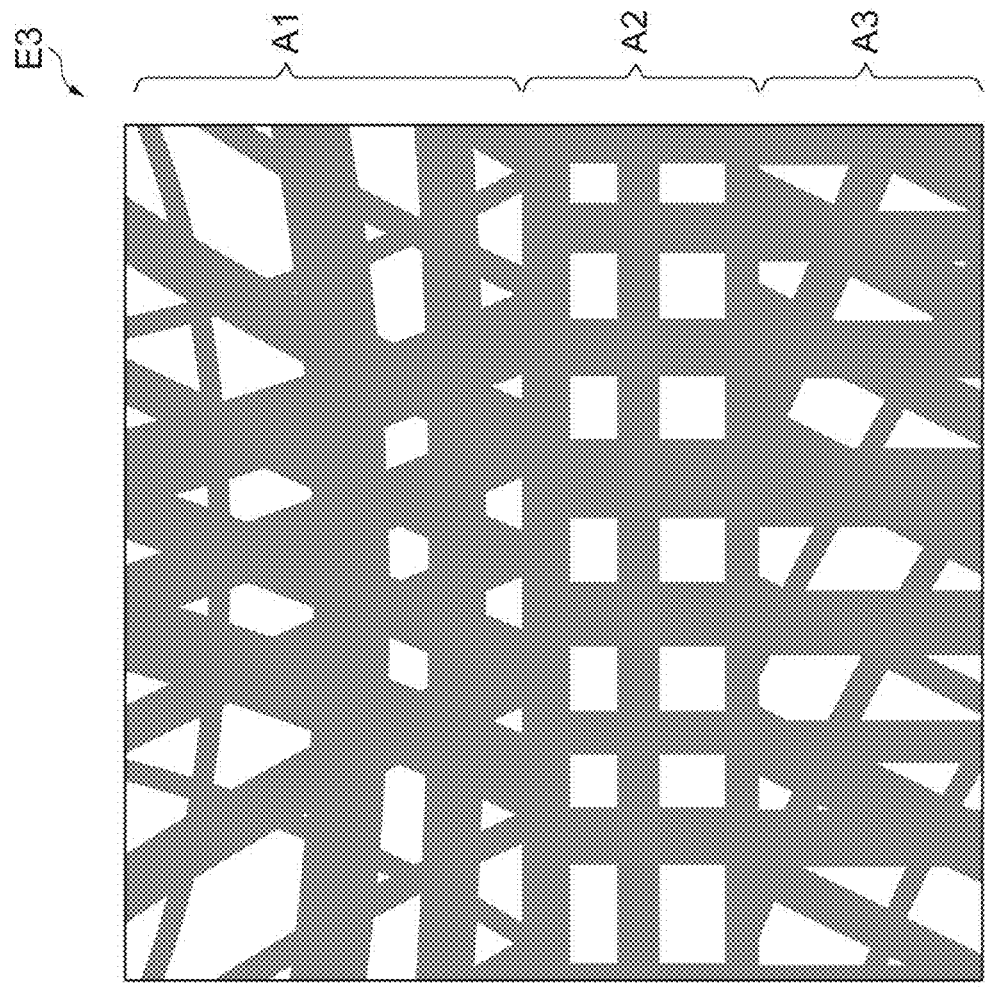
FIG. 21 is a plan view of a drive electrode.

FIG. 21 is a plan view of a drive electrode E3. In the first region A1 and the second region A2 of FIG. 21, the above-described various patterns can be disposed. That is, in this example, the pattern shown in FIG. 13 is disposed in the first region A1, the pattern shown in FIG. 6 is disposed in the second region A2, and the pattern shown in FIG. 12 is disposed in the third region A3.

As described above, in any of the semiconductor laser devices, the drive electrode has a non-periodic structure, so that noise light can be reduced, and by coupling to a spatial light modulator, a variable desired laser beam pattern can be formed.

REFERENCE SIGNS LIST

SLM . . . spatial light modulator, LED . . . semiconductor laser chip, 4 . . . active layer, 2, 7 . . . cladding layer, 6 . . . diffraction grating layer.

The invention claimed is:

1. A semiconductor laser device that comprises a semiconductor laser chip and a spatial light modulator optically coupled to the semiconductor laser chip, and modulates a laser beam output along a thickness direction of the semiconductor laser chip by the spatial light modulator and outputs the laser beam to the outside, wherein
the semiconductor laser chip includes:
an active layer;
a pair of cladding layers sandwiching the active layer;
a diffractive grating layer optically coupled to the active layer; and
a drive electrode that is disposed between the cladding layer on the spatial light modulator side and the spatial light modulator, and supplies an electric current to the active layer, and
in a case where an XYZ three-dimensional orthogonal coordinate system is set,
a thickness direction of the semiconductor laser chip is set as a Z-axis direction, and
a plane parallel to an interface between the semiconductor laser chip and the spatial light modulator is set as an XY plane,
the drive electrode is positioned within the XY plane,
the drive electrode has a plurality of openings as viewed from the Z-axis direction, and
the drive electrode has a non-periodic structure.

2. The semiconductor laser device according to claim 1, wherein
the drive electrode includes a plurality of conductive regions linearly extending along a first direction within the XY plane, and
when widths of the conductive regions in the X-axis direction are Xe,
intervals between the conductive regions in the X-axis direction are Xs,
N is an integer,
a width Xe of the conductive region positioned N-th along the X-axis direction is Xe(N), and
an interval Xs positioned N-th along the X-axis direction is Xs(N),
the widths Xe are not periodic, Xe(N) and Xe(N+1) are different from each other,
the intervals Xs are not periodic, and Xs(N) and Xs(N+1) are different from each other.

3. The semiconductor laser device according to claim 1, wherein
the drive electrode has a shape in which
a plurality of first conductive regions extending along a first direction and
a plurality of second conductive regions extending along a second direction different from the first direction
overlap so as to form a plurality of openings two-dimensionally positioned within the XY plane, and
when widths of the first conductive regions in the X-axis direction are Xe1,
intervals between the first conductive regions in the X-axis direction are Xs1,
N is an integer,
a width Xe1 of the first conductive region positioned N-th along the X-axis direction is Xe1(N), and
an interval Xs1 positioned N-th along the X-axis direction is Xs1(N),
the widths Xe1 are not periodic, Xe1(N) and Xe1(N+1) are different from each other,
the intervals Xs1 are not periodic, and Xs1(N) and Xs1(N+1) are different from each other.

4. The semiconductor laser device according to claim 3, wherein both or either of the first conductive regions and the second conductive regions extend in arcs.

5. The semiconductor laser device according to claim 1, wherein
the drive electrode has a shape in which
a plurality of first conductive regions extending along a first direction,
a plurality of second conductive regions extending along a second direction different from the first direction, and
a plurality of third conductive regions extending along a third direction different from both of the first direction and the second direction
overlap so as to form a plurality of openings two-dimensionally positioned within the XY plane.

6. The semiconductor laser device according to claim 1, wherein
a region in which the drive electrode is provided includes
a first region in which a conductive region having a first non-periodic structure is fainted and
a second region in which a conductive region having a second non-periodic structure different from the first non-periodic structure is formed.

* * * * *